United States Patent
Brauch et al.

[11] Patent Number: 6,157,755
[45] Date of Patent: Dec. 5, 2000

[54] LASER SYSTEM

[75] Inventors: Uwe Brauch, Stuttgart; Hans Opower, Krailling; Adolf Giesen, Renningen, all of Germany

[73] Assignees: Deutsches Zentrum fuer Luft-und Raumfahrt e.V., Bonn; Universitaet Stuttgart Institut fuer Strahlwerkzeuge, Stuttgart, both of Germany

[21] Appl. No.: 09/042,597

[22] Filed: Mar. 16, 1998

[30] Foreign Application Priority Data

Mar. 17, 1997 [DE] Germany ............................ 197 10 985
Mar. 10, 1998 [DE] Germany ............................ 198 10 243

[51] Int. Cl.$^7$ .................................................. G02B 6/26
[52] U.S. Cl. .................................. 385/31; 385/14; 385/38; 385/39; 385/42; 385/129; 385/130; 385/115; 385/116; 372/43; 372/50
[58] Field of Search ................................. 385/31, 38, 39, 385/14, 129, 130, 131, 132, 42, 40, 88, 89, 115, 116; 372/43, 50

[56] References Cited

U.S. PATENT DOCUMENTS

| | | | |
|---|---|---|---|
| 4,757,268 | 7/1988 | Abrams et al. | 330/4.3 |
| 5,013,151 | 5/1991 | Hughes | 356/152 |
| 5,159,656 | 10/1992 | Goldstein | 385/116 |
| 5,233,673 | 8/1993 | Vali et al. | 385/3 |
| 5,268,978 | 12/1993 | Po et al. | 385/33 |
| 5,276,758 | 1/1994 | Hughes | 385/116 |
| 5,363,233 | 11/1994 | Pernick | 359/316 |

FOREIGN PATENT DOCUMENTS

| | | | |
|---|---|---|---|
| 0 723 323 | 7/1996 | European Pat. Off. | 385/89 X |
| 297 039 | 3/1989 | Germany | 385/89 X |
| WO 91/01056 | 1/1991 | WIPO | 385/89 X |
| WO 94/17575 | 8/1994 | WIPO | 385/89 X |
| WO 96/41404 | 12/1996 | WIPO | 385/89 X |

OTHER PUBLICATIONS

D. Botez, et al., "Flat–Phasefront Fanout–Type Power Amplifier Employing Resonant–Optical–Waveguide Structures," *Appl. Phys. Lett.*, 1993, vol. 63, No. 23, pp. 3113–3115.

*Primary Examiner*—Brian Healy
*Attorney, Agent, or Firm*—Barry R. Lipsitz

[57] ABSTRACT

In order to improve a laser system comprising a fiber bundle consisting of single mode fibers which form with a first end a fiber bundle end, at which a total radiation field, which can be imaged onto a target surface, is formed from laser radiation exiting from the first ends of the fibers, and which are coupled with a second end to a subsystem generating the laser radiation with at least one semiconductor laser, such that this also operates efficiently with semiconductor lasers or semiconductor laser amplifiers and can be realized in an inexpensive manner it is suggested that the subsystem comprise a plurality of semiconductor laser units operating parallel, that all the semiconductor laser units of the subsystem operate with the same wavelength in a phase-balanced manner relative to one another as a result of master laser radiation coupled into them and that individual laser radiation exiting from the individual semiconductor laser units of the respective subsystem be combined by means of a coupling device of the respective subsystem to form a coherent laser radiation field which can be coupled into one of the single mode fibers.

58 Claims, 16 Drawing Sheets

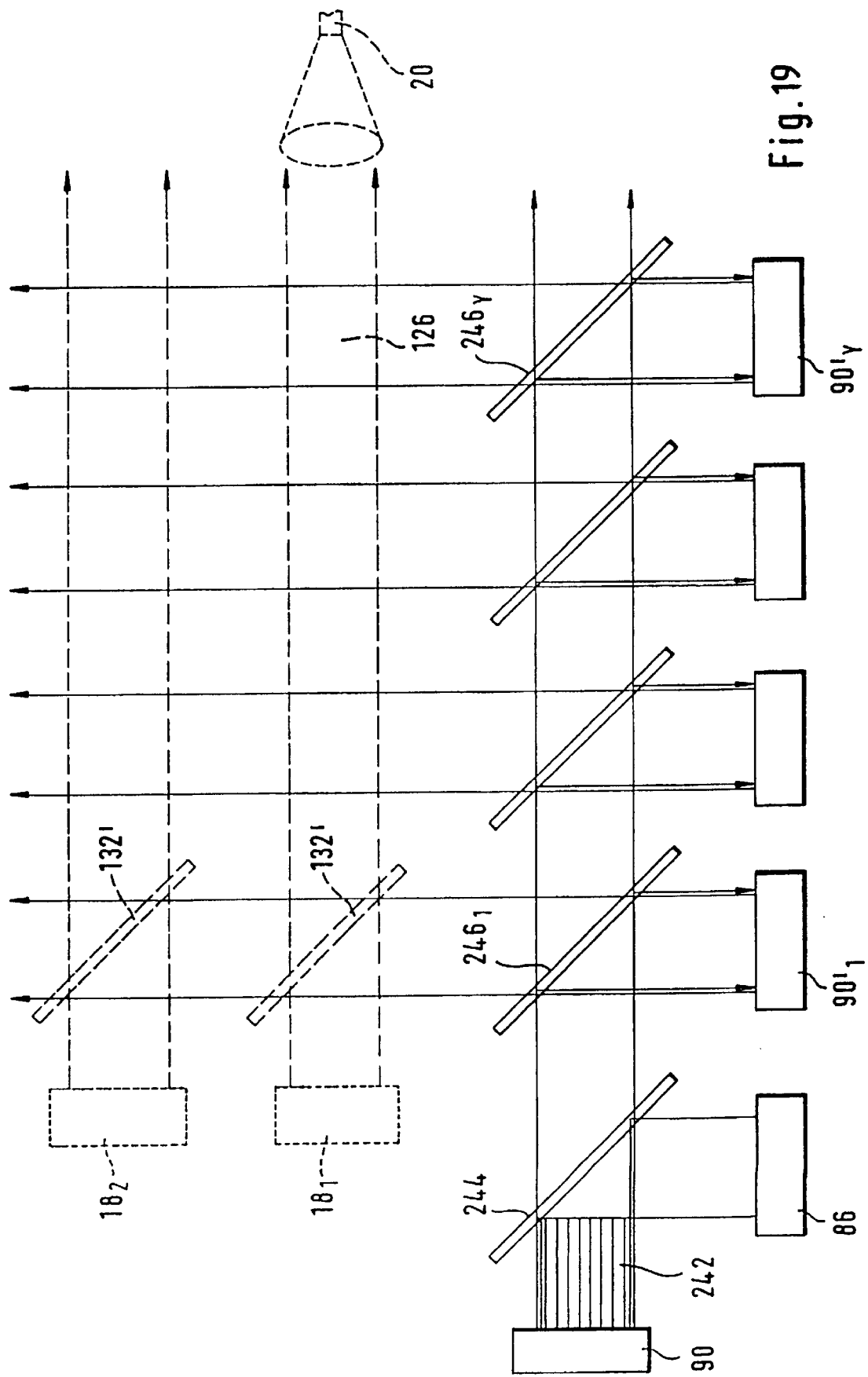

LASER SYSTEM

The invention relates to a laser system comprising a fiber bundle consisting of single mode fibers which form with their first ends a fiber bundle end, at which a total radiation field, which can be imaged onto a target surface, is formed from laser radiation exiting from the first ends of the fibers, and which are coupled with their second ends to a subsystem generating the laser radiation with at least one semiconductor laser.

Laser systems of this type are known from the state of the art.

For example, a laser system of this type is disclosed in WO 94/17575.

With this cited laser system it is assumed that a single semiconductor laser or a single semiconductor laser amplifier are respectively used as subsystem and the laser radiation generated by them is coupled each time into a single mode fiber and combined to form the total radiation field.

This solution can be realized when the single semiconductor laser serving as subsystem or the single semiconductor laser amplifier serving as subsystem each generate individual laser radiation with a sufficiently high power.

If, however, semiconductor lasers and semiconductor laser amplifiers are used which generate only power in the region of several hundred milliwatts, the known laser system is too expensive.

The object underlying the invention is therefore to improve a laser system of the generic type such that this also operates efficiently with semiconductor lasers or semiconductor laser amplifiers and can be realized in an inexpensive manner.

This object is accomplished in accordance with the invention, in a laser system of the type described at the outset, in that the subsystem comprises a plurality of semiconductor laser units operating parallel, that all the semiconductor laser units of the subsystem operate with the same wavelength in a phase-balanced manner relative to one another as a result of master laser radiation coupled into them and that individual laser radiation exiting from the individual semiconductor laser units of the respective subsystem is combined by means of a coupling device to form a coherent laser radiation field adapted to be coupled into the single mode fibers.

The advantage of the inventive solution is to be seen in the fact that as a result of a subsystem being formed from a plurality of semiconductor laser units, the individual laser radiation of which is combined by means of the coupling device to form a coherent laser radiation field, a simple possibility exists of also using semiconductor laser units which have low laser power, wherein an efficient combining of the individual laser radiation fields to form a coherent radiation field by means of the coupling device is possible in an efficient and inexpensive way only when the individual semiconductor laser units can be operated in a simple manner as a result of master laser radiation coupled into them such that they operate with exactly the same wavelength and in a phase-balanced manner in relation to one another so that the coherent radiation field can be generated with the coupling device in a simple manner on account of the individual laser radiations already phase-balanced in relation to one another.

In addition, the advantage of the inventive solution is to be seen in the fact that these subsystems themselves can be produced efficiently in the required number by means of integrated optical devices or microoptical components.

The inventive solution presupposes in this respect that all the semiconductor laser units of one subsystem are constructed and operate under such operating conditions that their modes and amplification profile are such that the master laser radiation predetermines a laser operation with one of the modes of the semiconductor laser unit so that the coupling in of master laser radiation results in all the semiconductor laser units then operating exactly at a wavelength which corresponds to the master laser radiation.

In principle, it would be possible to use as semiconductor laser units those, with which the master laser radiation can be coupled in on one side while the individual laser radiation exits from the semiconductor laser unit on the opposite side. Particularly efficient are, however, semiconductor laser units operating with master laser radiation, in which the master laser radiation can be coupled into the respective semiconductor laser unit through the output side.

This solution has the advantage that the optical elements for converting the laser mode of each semiconductor laser unit into the corresponding individual laser radiation field are also used in an inverse way to adapt the master laser radiation field in an optimum manner to the laser mode of the semiconductor laser unit which is intended to predetermine the master laser radiation.

Furthermore, this procedure has the advantage, in addition, that as a result of the coupling in of the master laser radiation from the output side phase jumps, which are caused, for example, by the reflector on the output side, are essentially the same for all the semiconductor laser units since the master laser radiation penetrates all the optical components, which are penetrated by the individual laser radiation and result in phase changes, in the reverse direction and thus, in the end, causes the individual laser radiation to result in each semiconductor laser unit with a phase relationship which takes into account the same subsequent phase changes due to the subsequent optical components.

In this respect, it is particularly favorable when the master laser radiation can be coupled in via a coupling-in element penetrated by the individual laser radiation so that the master laser radiation, on its way into each of the semiconductor laser units, penetrates the optical path into the semiconductor laser units which is penetrated by the individual laser radiation in the reverse direction.

A particularly favorable solution provides for the master laser radiation to be couplable into the semiconductor laser units via a coupling-in element penetrated by the coherent laser radiation field so that the master laser radiation can impinge on the coupling-in element in the form of a master laser radiation field which is easy to generate and has essentially plane wave fronts and the master laser radiation, on its way into the individual semiconductor laser units, likewise always experiences all the phase changes caused by the optical components to be passed through and thus is coupled into the respective semiconductor laser unit in an optimum manner.

A semiconductor laser unit is thereby to be understood not only as a semiconductor laser, in particular, a semiconductor laser oscillator but also as a semiconductor laser amplifier.

The use of a semiconductor laser is, however, particularly advantageous since, with it, a defined mode and a defined phase relationship in accordance with the master laser radiation can be maintained with more simple means than in the case of semiconductor laser amplifiers.

With respect to the design of the coupling device, no further details have been given in conjunction with the preceding explanations concerning the individual embodiments. One advantageous embodiment, for example, provides for the coupling device to unite the individual laser radiations by means of an optical imaging means to form the coherent laser radiation field which can be coupled into the single mode fiber.

The optical imaging means may preferably be designed such that it forms from the individual laser radiations individual laser radiation fields propagating parallel to one another and each having essentially plane wave fronts. Individual laser radiation fields of this type may then be combined to form a coherent laser radiation field in a particularly simple manner. It is, however, also possible for these individual laser radiation fields to already be, themselves, in phase with one another and thus themselves form the coherent laser radiation field.

In such a case of an optical imaging means, it is preferably provided for the optical imaging means to focus all the individual laser radiation fields of a subsystem into the single mode fiber provided for this.

When using an optical imaging means which generates individual laser radiation fields from the individual laser radiations, it is preferably provided for the master laser radiation to be couplable into the semiconductor lasers via the individual laser radiation fields since a relatively large beam cross section, via which the master laser radiation can be coupled in in an optimum manner, is available in the region of the individual laser radiation fields.

A particularly expedient solution provides for the master laser radiation to be couplable into the semiconductor lasers via a coupling-in element penetrated by all the individual laser radiation fields, i.e. a single coupling-in element covers all the individual laser radiation fields of the subsystem and is thus in a position to couple master laser radiation into all the semiconductor lasers of the subsystem at the same time.

When using an optical imaging means, the coupling of the individual laser radiation fields may be improved, in addition, by the optical imaging means comprising a phase plate which effects an even distribution of the intensity over the cross section of the respective individual laser radiation field and thus, as a result, the individual laser radiation fields are superposed in phase in an optimum manner.

An optical imaging means may be used as coupling element in a particularly favorable manner when the individual laser radiation is not guided through a waveguide but propagates as a free beam in the space and in this form penetrates the optical imaging means.

When using an optical imaging means as described above, it has proven to be particularly favorable when the master laser radiation can be coupled into the semiconductor lasers via a coupling-in element arranged between the optical imaging means and the single mode fiber since, in this case, it is possible, with the master laser radiation, to keep all the changes in the phase relationship caused by the optical imaging means essentially the same size for all the semiconductor laser units since the master laser radiation penetrates the entire optical imaging means in the opposite direction to the individual laser radiations so that any varying influence of the optical imaging means on the phase relationship of the individual laser radiation fields is as small as possible.

A further, advantageous inventive solution provides for the master laser radiation to be couplable into the semiconductor laser units via a coupling-in element formed from waveguides. Such a coupling-in element consisting of waveguides can either be arranged such that it is penetrated by the coherent laser radiation of the subsystem or it can be arranged such that a coupling-in element of this type is associated with each individual semiconductor laser.

A further alternative solution provides for the master laser radiation to be couplable into the semiconductor lasers via an optical diode as coupling-in element. In this case, the optical diode is preferably arranged such that the coherent laser radiation of the subsystem enters it and, in addition, the master laser radiation exits from the optical diode in the direction of the semiconductor lasers.

In conjunction with the preceding comments on the individual embodiments it has merely been explained that the master laser radiation enters the semiconductor laser units with approximately the same phase relationship for them all and thus causes the semiconductor laser units to operate with an essentially defined phase relationship relative to one another.

However, in order to be able to correct even small phase differences, in particular, in order to obtain an essentially complete phase correlation between the individual laser radiation fields, it is preferably provided for the semiconductor laser units of the respective subsystem to be each operated with part of the master laser radiation in a frequency and phase defined manner and for the part of the master laser radiation coupled into a respective one of the semiconductor laser units to penetrate a phase control element. The phase relationship of the individual laser radiation field can then be determined with such a phase control element for each individual one of the semiconductor laser units and thus the phase relationships of the individual laser radiation fields relative to one another, as well.

A relative phase relationship between the individual laser radiation fields is particularly favorable which results in a coherent superposition of all the individual laser radiations in an entry plane into the single mode fiber in such a manner that maximum power is coupled into the single mode fiber.

The phase control elements can be arranged, for example, such that they are penetrated by the respective part of the master laser radiation and also the respective individual laser radiation field so that the correction brought about by the phase control element has an effect on not only the part of the master laser radiation which impinges on the respective semiconductor laser unit but also the individual laser radiation field generated by this semiconductor laser unit.

It is, however, even more advantageous when the phase control elements are arranged outside the individual laser radiation fields, i.e. when they are penetrated merely by that part of the master laser radiation which then acts on the respective semiconductor laser unit.

In this respect, it is particularly favorable when the phase correction elements correct phase relationships in the individual parts of the master laser radiation prior to their superposition with the individual laser radiation fields since, in this case, the arrangement of the phase control elements is particularly favorable, and the individual laser radiation fields no longer pass through the phase correction elements which are, generally, subject to loss.

With respect to the mode of operation of the phase control elements, the most varied variations are conceivable. It would, for example, be conceivable to control the phase control elements such that these can be set once and then the phase correction value remains unaltered. The problem with this solution is, however, that thermal variations, for example, changes in the individual phase relationships as a result of different thermal expansions cannot be subsequently corrected. For this reason, one advantageous embodiment provides for the phase control element to be controlled by a control in a defined manner and thus for it to be possible by means of the control to constantly adapt the phase relationship corrected by the phase correction value to changes in the phase relationship which may possibly occur.

The control can, for example, control the phase control elements on the basis of stored correction values.

In this respect, it is particularly favorable when the control detects a relative phase relationship of the individual laser radiation fields relative to one another by means of detector elements associated with the individual laser radiation fields and then, on the basis of the detected phase relationship, controls the phase control elements for the individual parts of the master laser radiation which act on the individual semiconductor laser units generating the individual laser radiation fields so that a phase regulation is thereby possible.

Such a detection of the relative phase relationship of the individual laser radiation fields relative to one another is possible in different ways. A particularly advantageous procedure provides for the control to detect the relative phase relationship of the individual laser radiation fields by superposing them with a reference laser radiation. For example, the radiation of an individual laser radiation field could be used as reference laser radiation which is then superposed on all the other individual laser radiation fields so that the relative phase relationship of the individual laser radiation fields relative to one another can be recognized at the detectors.

A particularly simple way of ascertaining the relative phase relationship of the individual laser radiation fields relative to one another provides for the reference laser radiation to be formed by a coupled-out part of the master laser radiation which impinges on all the detectors and thus generates an intensity signal, which specifies the relative phase relationship, at the detectors in superposition with the respective individual laser radiation fields.

The semiconductor laser units of the subsystem can be arranged in different ways. For example, it would be conceivable to provide individual semiconductor laser elements for each subsystem.

In this case, the semiconductor laser units of the subsystem are preferably arranged to follow one another in at least one direction. Such an arrangement of the semiconductor laser units is, however, particularly advantageous when all the semiconductor laser units of the subsystem are combined in one block.

Even greater power with as compact a construction as possible may be attained, in particular, when the semiconductor laser units of the subsystem are arranged in one surface so that the laser radiation exits and can be coupled from a two-dimensional arrangement of semiconductor laser units.

In this respect it is particularly favorable when the semiconductor laser units of the subsystem are arranged in the surface in a defined surface pattern.

The semiconductor laser units could, for example, be edge emitters combined in blocks, wherein several blocks are located one on top of the other, each with a plurality of edge emitters arranged to follow one another in one direction, so that, in the end, the exit surfaces of all the edge emitters are likewise located in one surface and the individual laser radiation exits approximately at right angles to this surface.

Such an arrangement can, however, be realized in an even simpler manner when the semiconductor laser units of the subsystem are vertical emitters which may be arranged in a simple manner on a substrate in one surface so close to one another that the laser power per surface unit which can be achieved is greater than in systems of a different construction.

In the case of such vertical emitters used as semiconductor laser units external coupling-out mirrors may be realized in a particularly simple manner, wherein concave coupling-out mirrors are preferably used as coupling-out mirrors for the semiconductor lasers.

Such an external resonator has the advantage that defined laser modes can be set with it.

A semiconductor laser preferably operates with such an external coupling-out mirror such that the individual laser radiation exits from the respective, individual semiconductor laser preferably as a free beam.

It would, for example, be conceivable to provide a separate and adjustable coupling-out mirror for each individual semiconductor laser. This does, however, have the disadvantage that a plurality of individual coupling-out mirrors are required. In this respect, it is particularly favorable when the coupling-out mirrors are arranged on a support.

A solution which is particularly favorable with respect to the parts to be used provides for the coupling-out mirror to be designed as a coating on one element of the optical imaging means and thus the optical imaging means is provided with its coating on a side of the optical imaging means preferably facing the semiconductor lasers. In this case, the number of optical elements can be reduced in a relatively simple manner and, in addition, the entire unit can be produced very inexpensively.

Also in the case of all the units, in which an external coupling-out mirror is provided, the individual laser radiation is preferably not guided in a waveguide but propagates freely in the space, merely influenced by the penetrated optical imaging means.

Alternatively to the propagation of the respective individual laser radiation freely in the space, another preferred embodiment provides for the individual laser radiation of each semiconductor laser element to be couplable into a first waveguide designed as a waveguide structure on a support. This solution has the advantage that, on the hand, it is simple to construct and, on the other hand, the production of an inventive subsystem can be realized in a particularly inexpensive manner without any great, complicated adjustment.

In this respect, it is particularly advantageous when the first waveguides of several semiconductor laser units are arranged on a common support; it is even more advantageous when the first waveguides of all the semiconductor laser units of the respective subsystem are arranged on a common support. With such a solution, a plurality of components receiving the individual laser radiations may be produced in a particularly simple manner as integrated optical means.

In order to be able to couple in the master laser radiation in a particularly efficient manner in such a solution, it is provided for the first waveguides to guide the individual laser radiation, which is coupled in, to a coupling-in element which, on the one hand, couples the individual laser radiation further in a second waveguide leading to the single mode fiber and, on the other hand, couples the master laser radiation into the first waveguide. Such a solution has the advantage that it may be produced in a simple manner, on the one hand, and in this respect an efficient coupling in of the master laser radiation into each individual laser radiation can still take place in a simple manner with a respective coupling-in element provided for this purpose.

This solution is even more favorable when the second waveguides are arranged as a waveguide structure on a support and thus the second waveguides can also be likewise produced in the form of an integrated optical means.

Particularly great advantages result when the coupling-in elements are arranged as waveguide structures on a support so that the coupling-in elements themselves can likewise be coupled and positioned in a simple manner in relation to the first waveguides and, where applicable, the second waveguides, as well, as waveguide structure.

In principle, it is also possible with such a solution to arrange the coupling device between the first waveguides and the coupling-in element for the master laser radiation and thus, on the one hand, to have only one coupling-in element but, on the other hand, to still have the possibility of having the laser radiation coupled in passing through the coupling device itself and thus of already taking into consideration all the changes in the phase relationship caused by the coupling device via the phase of the master laser radiation in the semiconductor laser. As a result, each semiconductor laser element generates its individual laser radiation in a phase-balanced manner relative to the others and this radiation then has a phase relationship identical to the other individual laser radiations after passing through the respective components and also the coupling device and so at the end of the coupling device all the individual laser radiations are superposed in phase without additional phase control elements being required—insofar as the lengths of the optical paths are identical. This takes place exclusively due to the fact that the coupling in of the master laser radiation takes place after the essential components responsible for the change in the phase relationship.

An even more favorable solution provides, however, for the coupling device to be arranged between the second waveguides and the single mode fiber so that the coupling device, in the end, couples the individual laser radiations leaving the second waveguides with one another in an inphase manner.

No further details have been given with respect to the construction of the coupling device itself. One advantageous embodiment, for example, provides for the coupling device to be designed as a waveguide coupler.

In this respect, it is particularly favorable when the coupling device is designed as a waveguide structure on a support, wherein the support is preferably the same support as that which supports the first and, where applicable, also the second waveguides and, where applicable, also coupling-in elements.

Such a coupling device is preferably constructed such that it comprises coupling elements each having two inputs and at least one output and that the individual laser radiations entering at the inputs are superposed at the respective output. Such a solution can be used, for example, particularly advantageously when the master laser radiation is coupled in after the coupling device and thus passes through the coupling device on its way to the respective semiconductor lasers. In this case—insofar as the lengths of the optical paths are identical—no additional phase adjustment whatsoever is required since each semiconductor laser operates, as a result of the master laser radiation, in a phase relationship which ensures that the individual laser radiation has, after passing through the coupling device, precisely such a phase relationship which is in phase with the individual laser radiations of the remaining semiconductor laser units in order to ensure that all the individual laser radiations of all the semiconductor laser units are superposed to form a coherent laser radiation field.

In order to be able to compensate for possible variations in the lengths of the optical paths, an additional advantageous solution provides for each of the coupling elements to be provided with a phase control element in order to superpose the laser radiations propagating in the two waveguide structures in a phase-defined manner. For example, it is possible with such a phase control element to select the phase of the two laser radiations such that an inphase superposition thereof results on the output side of the coupling element.

It is, therefore, possible with the phase control element to predetermine the phase relationship, with which the laser radiations are superposed.

Such a phase control element can also be used to modulate the laser radiation, which is adapted to be coupled out at the output of the coupling element, between maximum intensity and intensity zero as required solely by way of the phase relationship adjustable with the phase control element. A particularly expedient solution of such a coupling element provides for the coupling element to have two inputs and two outputs and for a radiation detector, with which the phase control element can be controlled, to be arranged at one output.

With such a radiation detector the intensity of the incoming laser radiation can be detected and thus it can also be recognized what intensity is present at the other output since the intensities at the two outputs are complementary.

It is, for example, possible with this solution to connect to the radiation detector a control for the phase control element which controls the phase control element such that the radiation detector detects the smallest possible intensity, preferably intensity close to zero; in this case it is, namely, ensured that the laser radiations at the other output of the coupling device are superposed in phase.

A favorable way to regulate provides for an additional, slight phase modulation about the nominal position.

The coupling elements can, in principle, be designed in any optional manner. For example, it is conceivable to design the coupling elements such that the laser radiation is formed as a free beam. It is, however, also conceivable to design the coupling elements as fiber couplers or advantageously provide for the coupling elements to be arranged as waveguide structures on the support.

In all the cases, in which the waveguides or the coupling-in elements or the coupling elements are designed as a waveguide structure on a support, it is particularly advantageous when the support is designed as electro-optical or as semiconductor material. The waveguide structures are thereby formed, for example, by diffusing in suitable components which convey waveguide properties to the support material.

In addition, the use of electro-optical materials or semiconductor materials has the advantage that phase control elements may be realized in this way in a particularly simple manner, for example, in the case of an electro-optical material by this being arranged between two electrodes and thus the application of a voltage between the electrodes leading to a defined phase shift.

With respect to the generation of the master laser radiation, no further details have been given in conjunction with the preceding explanations concerning the individual embodiments. One advantageous embodiment, for example, provides for the master laser radiation for all the subsystems to be generatable by means of a master laser radiation generator.

It is preferably provided in the inventive solution for the master radiation generator to operate all the subsystems with the same wavelength and in a phase-balanced manner relative to one another, wherein the phase-balanced operation of all the subsystems does not necessarily make it imperative for these subsystems to be operated with master laser radiation which is in phase but the term phase-balanced is intended to expressly allow for the master laser radiation which is used for operating the different subsystems to vary with respect to the phase relationship but for this variation of the phase relationship to be fixedly maintained.

Such a master laser radiation may preferably be generated by the master laser radiation generator supplying each of the subsystems with master laser radiation which is derived from a single basic master radiation.

In this respect, the master laser radiation is preferably generated by the master laser radiation generator being designed as a maser laser radiation cascade.

Such a master laser radiation cascade is expediently constructed such that it has a basic master laser as well as master semiconductor lasers of a master semiconductor laser system which operate via its basic master laser radiation with the same wavelength and in a phase-balanced manner relative to one another and which, for their part, again generate the master laser radiation.

The master laser radiation cascade preferably comprises several master semiconductor laser systems which are arranged in a cascade, in which one master semiconductor laser system, for its part, generates the master laser radiation for additional master semiconductor laser systems.

The master semiconductor laser systems can be constructed in various different ways; for example, it is conceivable to construct the master semiconductor laser systems in exactly the same way as the subsystems of the laser system.

It is, however, also conceivable to construct the master semiconductor laser systems such that they comprise a plurality of master semiconductor lasers which operate in a phase-balanced manner relative to one another on account of master laser radiation which is coupled in, wherein in the simplest case each of the master semiconductor laser systems again generates master laser radiation which can then be used directly for the purpose of supplying subsequent master semiconductor laser systems with master laser radiation again or also supplying subsystems of the laser system directly with master laser radiation.

Additional features and advantages of the invention are the subject matter of the following description as well as the drawings illustrating several embodiments.

In the drawings:

FIG. 3 shows a schematic illustration of an inventive phase detector;

FIG. 18 shows a schematic illustration of a first embodiment of an inventive master semiconductor laser system and FIG. 19 shows a schematic illustration of a master laser radiation generator with master semiconductor laser systems in accordance with a second embodiment.

Figure 1:
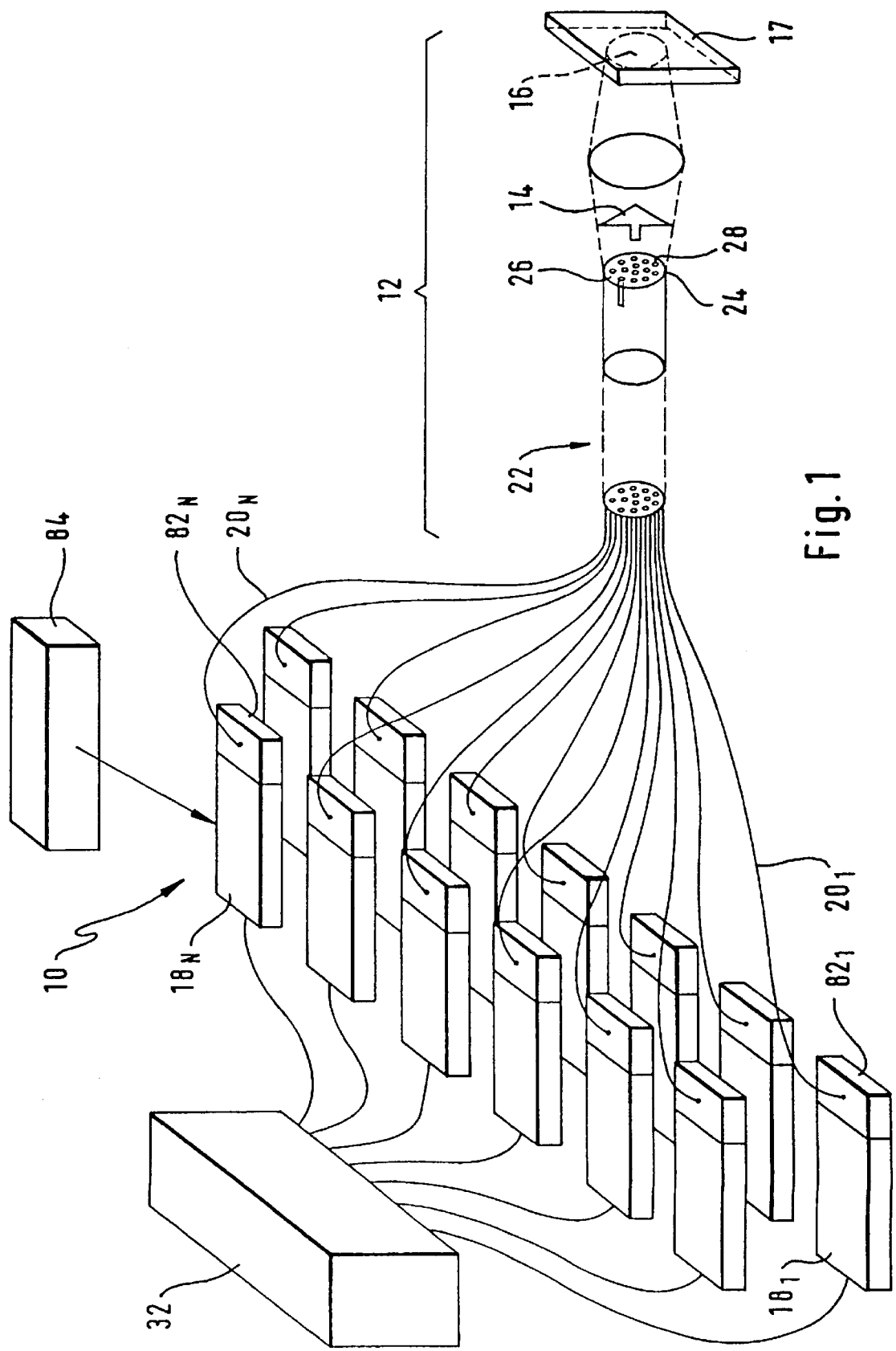
FIG. 1 shows a schematic illustration of a first embodiment of an inventive laser system.

A first embodiment of an inventive laser system, illustrated in FIG. 1, comprises a first variation of a radiation generating system 10, to which a light guide system 12 is connected which emits a total laser radiation 14 impinging, for its part, on a target surface 16 of an object 17 to be irradiated.

Figure 2:
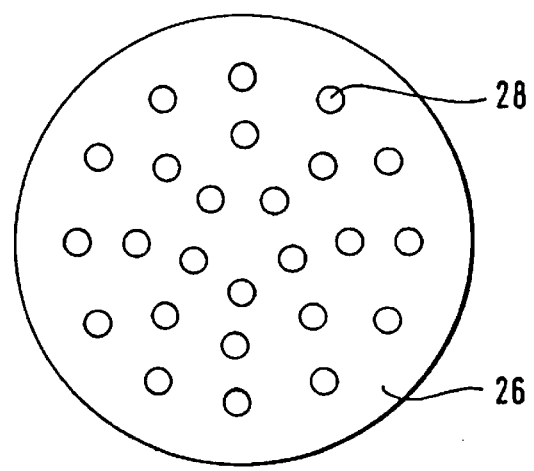
FIG. 2 shows a plan view of an end surface of the light guide system in the first embodiment.

The radiation generating system 10 comprises, for its part, a plurality of subsystems $18_{1\ to\ N}$, each of which generates laser radiation and with which the laser radiation is coupled into a respective single mode fiber $20_{1\ to\ N}$. All the single mode fibers $20_{1\ to\ N}$ are combined to form a fiber bundle 22 which is comprised by the light guide system 12 and has an end 24, from which the total laser radiation 14 exits. In this respect, all the fiber end surfaces 28 of the single mode fibers 20 are preferably located at the end 24, as illustrated in FIGS. 1 and 2, in an end surface 26.

All the subsystems $18_{1\ to\ N}$ can be operated such that they work at the same frequency in a frequency-stabilized manner and, moreover, a relative phase relationship of the laser radiation field can be specified in a defined manner, wherein the phase relationship can be specified by means of a control 32 such that the superposition of the laser radiations of several or all the semiconductor laser units 18 propagating as total laser radiation 14 and proceeding from the fiber end surfaces 28 leads to a total laser radiation field 14 which propagates with a definable, for example, a plane wave front.

In order to be able to determine the phase relationship of the laser radiation from each individual subsystem at each individual fiber end surface 28 (FIG. 3), the light guide system 12 is provided with a phase detector 40 which comprises a beam splitter, preferably a diffractive reflector 42, and an imaging element for part of the total laser radiation 14, wherein the diffractive reflector is arranged at a distance from the end surface 26 and in front of it as well as facing this end surface 26 so that the total laser radiation field 14 penetrates it and is partially reflected by it. It is particularly favorable when the diffractive reflector 42 serves at the same time as imaging element so that an additional optical imaging means can be omitted.

Part of the total laser radiation field 14 is imaged by the diffractive reflector 42 onto two detector surfaces 44 and 46 of two matrix detectors 48 and 50, respectively, wherein at least one matrix element 52 or 54 of each detector surface 44 or 46 is clearly associated each time with a respective fiber end surface 28 which is synonymous with a distinct association of at least one matrix element 52 or 54 with one of the respective semiconductor laser units 18.

As a result, it is possible by means of each matrix element 52 or 54 to detect the intensity of the laser radiation generated by the respectively associated subsystem 18 on account of the diffractive reflector 42.

In order, however, to detect the phase relationship of the laser radiation field of each of the subsystems 18 by way of the matrix elements 52 or 54, a fiber end surface 56 of a reference fiber 58 is provided next to the diffractive reflector and is likewise connected to a reference subsystem 18R, wherein the reference subsystem 18R is preferably identical to the remaining subsystems 18 and, in particular, operates with the same frequency although it is not controlled with respect to its phase relationship but itself supplies a reference phase relationship.

The reference phase relationship of the reference subsystem 18R can be detected by each of the matrix elements 52 or 54 in that a spherical wave propagates from the fiber end surface 56, wherein this spherical wave covers not only the entire detector surface 44 but also the detector surface 46.

Thus, in the case of each of the matrix elements 52 and 54 of the detector surfaces 44 and 46, respectively, the reference radiation field of the reference subsystem 18R arrives next to the laser radiation field of the respectively associated subsystem 18 reflected by the diffractive reflector 42, wherein the two laser radiation fields interfere and thus, depending on their relative phase relationship to one another, a value between an intensity maximum and an intensity minimum can be detected at the respective matrix element 52 or 54.

An additional modulation of the reference radiation field emitted from the fiber end surface 56 of the reference fiber 58 with a modulator 60 enables, in addition, an intensity measurement of the laser radiation field of each subsystem to be carried out with each of the matrix elements 52 or 54 and this is likewise of significance for the measurement of the phase relationship to a certain extent in order to check whether a laser radiation field has in fact been generated by the respective subsystem $18_{1\ to\ N}$.

Furthermore, the diffractive reflector 42 is designed such that it reflects the laser radiation field from each individual one of the fiber end surfaces 28 in a polarization-dependent manner either to the detector surface 44 or to the detector surface 46 so that by comparing the intensities which are received by the matrix elements 52 and 54 and are each associated with a fiber end surface 28 and thus a subsystem 18, this allows a determination of the polarization in addition to the phase relationship.

The measurements of intensities in the case of the individual matrix elements 52 and 54 on the detector surfaces 44 and 46, respectively, leads to particularly good results when the intensity of the laser radiation field reflected by the diffractive reflector 42 and the intensity of the reference radiation field emitted by the fiber end surface 56 of the reference fiber 58 are approximately of equal size in each matrix element 52 and 54. Furthermore, in the case of the measurements by means of the individual matrix elements 52 and 54, a difference in distance of the laser radiation emanating from the fiber end surface 56 to the individual matrix elements 52 is to be taken into account and, in addition, a difference in distance between each of the fiber end surfaces 28 and the corresponding matrix element 52 and 54, respectively, via the diffractive reflector 42. These differences in distance result in additional shifts in the phase relationships and so these differences must be taken into consideration when the same phase relationship is intended to be established with the phase detector 40 at all the fiber end surfaces 28, namely in the end surface 26.

The matrix detectors 48 and 50 are preferably designed as CCD cameras, each pixel of which represents a matrix element 52, 54.

As illustrated, in addition, in FIG. 3, the diffractive element is followed by an optical imaging means 62 which images the total laser radiation field 14 onto the target surface 16, wherein the optical imaging means 62 is preferably configured such that a coherent imaging, i.e. an imaging of the phase-correlated total laser radiation field 14 takes place, wherein this is, in the simplest case, mostly an imaging onto the focal plane of the optical imaging means 62, i.e. the target surface 16 is preferably located in the focal plane.

The actual control of the phase relationship of the laser radiation which is guided from the single mode fibers 20 takes place in the region of the radiation generating system 10.

Each of the matrix elements 52 and 54 of the matrix detectors 48 and 50 thus represents one of the fiber end surfaces 28 in the end surface 26 and thus the laser radiation field of a subsystem 18 and so its particular phase relationship can be detected.

In the simplest case, the number of matrix elements 52 and 54 present in the case of the matrix detectors 48 and 50, respectively, is exactly the same as the number of fiber end surfaces 28 located in the end surface 26. For example, this is likewise exactly N matrix elements 52 and 54.

Figure 4:
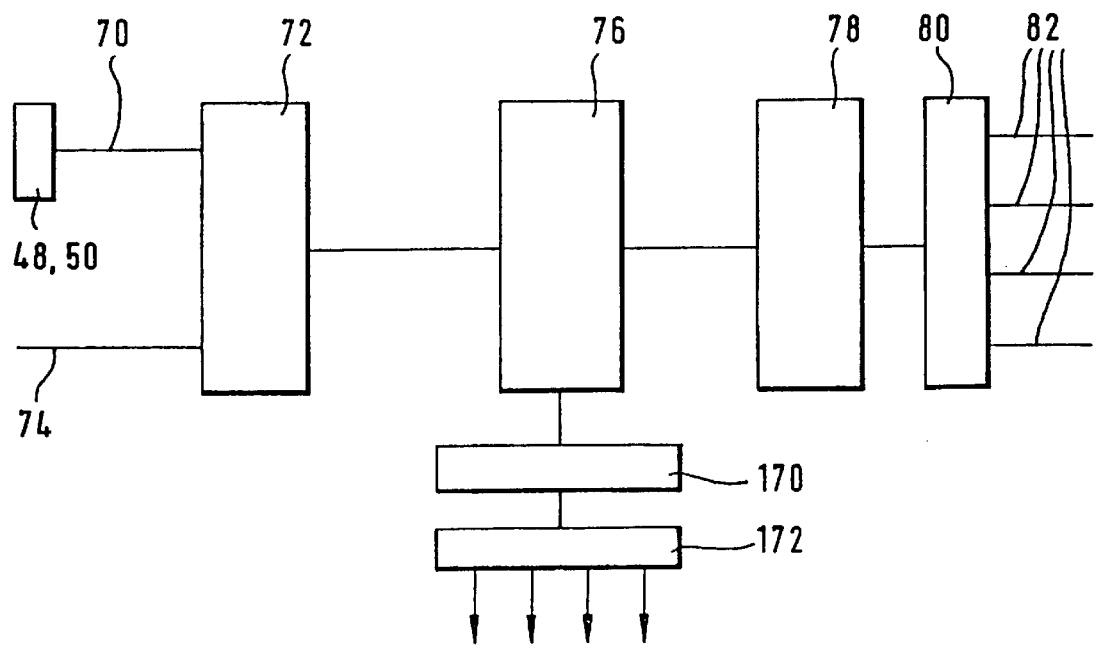
FIG. 4 shows a schematic illustration of the control in the form of a block diagram.

The intensities measured by all the $52_1$ to $_N$ or 54 to N matrix elements are constantly read out of the respective matrix detectors 48 and 50 and recorded via a read-out line 70 by a computer unit 72 which determines the phase relationship from the intensities detected by the respective matrix elements 52 and 54. For this purpose, the computer unit 72 receives in addition via a line 74 a synchronization signal which indicates the state of the modulator 60 (FIG. 4). In the simplest case, the modulator 60 is a chopper which switches the laser radiation of the reference subsystem 18R on and off at regular intervals.

The phase relationship determined by the computer unit for each of the subsystems $18_{1\ to\ N}$ is supplied via a bus system 76 to a phase control 78 which controls a plurality of phase adjusting means $82_{1\ to\ N}$ again via a bus system 80, wherein each phase adjusting means $82_{1\ to\ N}$ is associated with one of the respective subsystems in order to set the phase of the laser radiation field generated by this subsystem 18 in accordance with the specifications of the phase control 78 and thus to correlate the phase relationships of all the subsystems $18_{1\ to\ N}$ with one another such that these phase relationships lead to the predetermined phase distribution in the end surface 26 of the light guide system 12.

In order to operate the individual subsystems $18_1$ to $_N$, on the one hand, with exactly the same wavelength and, on the other hand, in a phase-balanced manner relative to one another, a master laser radiation generator 84 is provided, by means of which each of the subsystems $18_1$ to $_N$ can be supplied with master laser radiation which allows each of the subsystems $18_1$ to $_N$ to be operated at exactly the same wavelength and, on the other hand, at least in a phase-balanced manner relative to one another.

Figure 5:
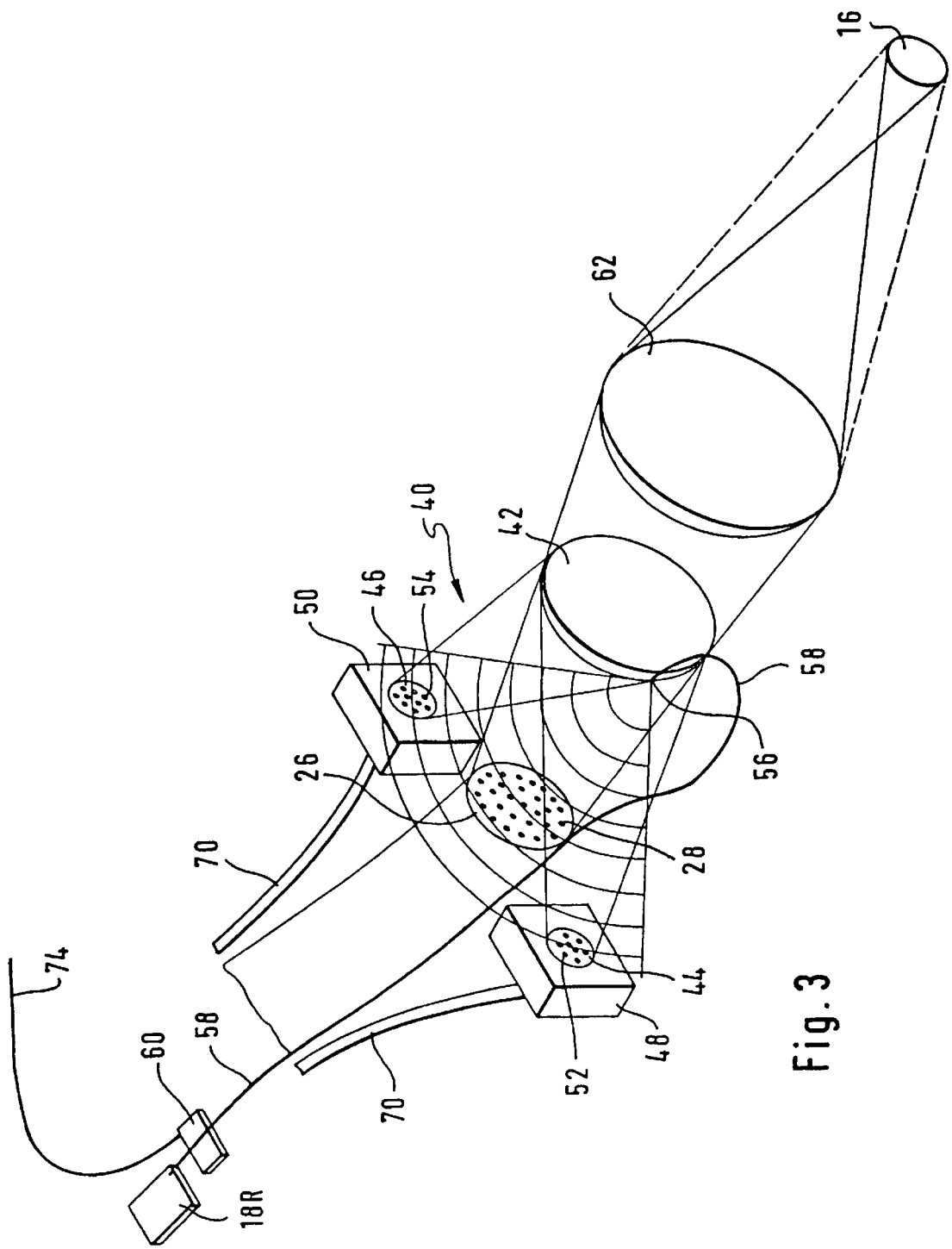
FIG. 5 shows a schematic illustration of one embodiment of a master laser radiation generator.

For this purpose, as illustrated in FIG. 5, the master laser radiation generator 84 has a basic master laser 86, with the basic master laser radiation of which a plurality of master semiconductor lasers $88_1$ to $_X$ are fed, which are combined to form a master semiconductor laser system 90 forming a unit.

The master semiconductor lasers $88_1$ to $88_X$ are operated with the basic master laser radiation such that they work, on the one hand, at exactly the same wavelength and, on the other hand, in a phase-balanced manner relative to one another and altogether generate master laser radiation which, for its part, is again used to operate a plurality of additional master semiconductor laser systems $90'_1$ to $90'_Y$ in a phase-balanced manner relative to one another in that the master laser radiation from the master semiconductor laser system 90 causes the master semiconductor lasers $88_1$ to $88_X$ of each individual one of the master semiconductor laser systems $90'_1$ to $90'_Y$ to operate, on the one hand, with exactly the same wavelength and, on the other hand, again in a phase-balanced manner relative to one another.

Each of these additional master semiconductor laser systems $90'_1$ to $90'_Y$ serves, for its part, to again generate master laser radiation which can be divided and serves to supply each of the subsystems $18_1$ to $18_N$ with master laser radiation, wherein the master laser radiation which is guided to the individual subsystems $18_1$ to $18_N$, again serves to operate the individual subsystems $18_1$ to $18_N$ at exactly the same wavelength and in a phase-balanced manner relative to one another but not necessarily in phase, wherein each of the individual, additional master semiconductor laser systems $90'_1$ to $90'_Y$ supplies several subsystems 18 with master laser radiation. In this respect the number Y of the additional master semiconductor laser systems $90'_Y$ multiplied by the number of the outputs of each of these individual master semiconductor systems $90'_1$ to $_Y$ results in the number N of the subsystems $18_1$ to $18_N$.

Figure 6:
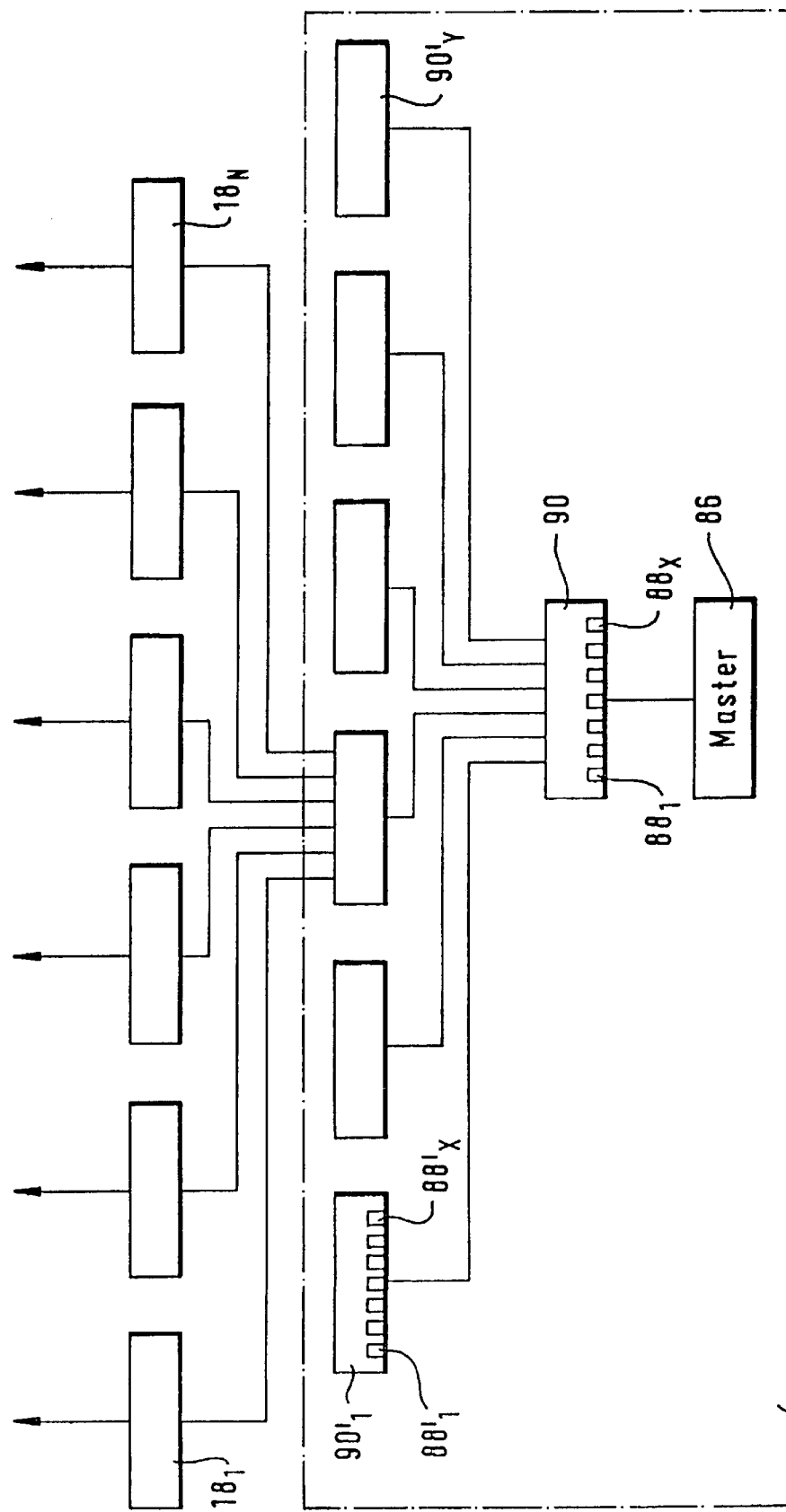
FIG. 6 shows a first embodiment of an inventive subsystem.
Figure 7:
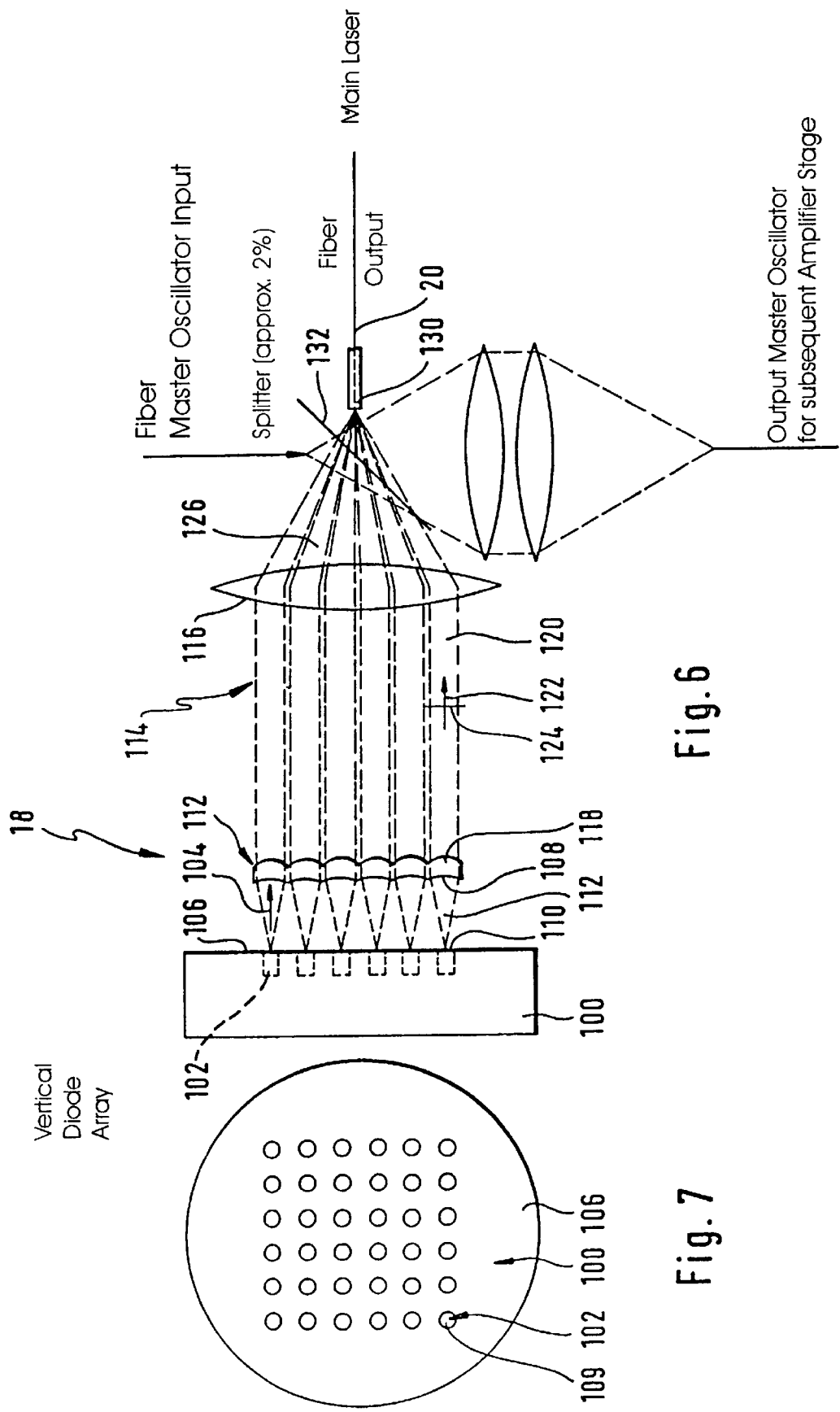
FIG. 7 shows a plan view of the arrangement of the semiconductor lasers in the first embodiment.

The subsystems $18_1$ to $_N$ can be constructed in the most varied of ways. A first embodiment of such a subsystem $18_1$ to $18_N$ comprises, as illustrated in FIG. 6, a plurality of vertical emitters 102 which are arranged on a substrate 100 and emit laser radiation in a direction 104 which extends approximately at right angles to a plane 106, in which the vertical emitters 102 are arranged. Each of the vertical emitters 102 is designed in a manner known per se to be reflecting on its side facing the substrate 100 and is provided with an external reflector 108 which is arranged at a distance above an end face 109 of the respective vertical emitter 102 facing away from the substrate 100 so that an individual laser radiation 111 is already formed between the reflector 108 and an exit surface 110 of the respective vertical emitter 102 located in the end face 109.

The reflector 108 is thereby preferably designed as a concave reflector focusing the individual laser radiation 111 onto the vertical emitter 102. The reflector 108 is preferably provided as a partially permeable and thus partially reflecting coating on a first element 112 of an optical imaging means which is designated as a whole as 114 and, in addition, also has a second element 116 which is designed in the simplest case as a focusing optical element.

The first element 112 of the optical imaging means 114 preferably comprises a plurality of individual lenses 118 which are arranged next to one another and altogether form a plate-like optical element, wherein the individual lenses 118 create an individual laser radiation field 120 from the individual laser radiation 111 exiting in a diverging manner from the respective vertical emitter 102, this field preferably propagating with a plane wave front 124 extending at right angles to its direction of propagation 122 following the first element 112.

The individual laser radiation fields 120 of all the vertical emitters 102 are preferably located as close as possible next to one another and, in addition, propagate parallel to one another. These individual laser radiation fields can then be focused with the second optical element 116 onto a second end 130 of the single mode fiber 20 belonging to this subsystem 18 and form at least after passing through the second optical element 116 a coherent laser radiation field 126 which is coupled into the single mode fiber 20.

In order to make it possible for all the vertical emitters 102 to operate, on the one hand, with exactly the same wavelength and, on the other hand, in a phase-balanced manner relative to one another, a beam splitter 132 is placed between the optical imaging means 114 and the second end 130 of the single mode fiber 20 and this represents a coupling-in element in order to couple master laser radiation generated by the master laser radiation generator 84 into the vertical emitters.

The beam splitter 32 is thereby designed as a partially reflecting beam splitter plate and arranged such that it does not reflect the master laser radiation in the direction of the second end 130 of the single mode fibers 20 but in the direction of the vertical emitters 102 so that the master laser radiation reflected from the beam splitter 132 in the direction of the vertical emitters 102 is reflected such that this passes through the optical imaging means 114 in the opposite direction to the laser radiation and penetrates not only the second optical element but also the first optical element 112 in order to thus enter all the vertical emitters 102 of this subsystem 18 parallel as a result of the likewise partially reflecting reflectors 108.

This means that all the vertical emitters 102 of the respective subsystem 18 operate, on the one hand, with exactly the same wavelength and, on the other hand, coupled in an inphase manner.

Due to the fact that the beam splitter 132 is arranged in front of the optical imaging means 114, the beam splitter 132 makes it possible for the master laser radiation to propagate in the direction of the semiconductor lasers 102 and pass through the optical imaging means 114 in the opposite direction to the individual laser radiation and thus keep all the vertical emitters 102 in this case, on the one hand, at exactly the same wavelength and, on the other hand, at such a phase relationship that the individual laser radiations form a common coherent laser radiation field after passing through the optical imaging means 114. This is possible, in particular, due to the arrangement of the beam splitter 132 essentially directly in front of the second end 130 of the single mode fiber 20 since, as a result, a phase change in the coherent master laser radiation reflected by the beam splitter 132 when passing through the optical imaging means 114 takes place in the opposite direction to the individual laser radiation in such a way that all the individual semiconductor lasers 102 are acted upon in parallel with master laser radiation of the same frequency and essentially the same phase relationship, wherein the phase relationships have experienced essentially the same phase changes and the respective individual laser radiations likewise experience essentially the same phase changes when passing through the optical imaging means 114.

The phase adjusting element 82 associated with this subsystem 18 can be designed, for example, such that it comprises one element for the defined heating of a section of the single mode fiber 20 so that in this section the refractive index of the material of the single mode fiber may be varied in a defined manner on account of this heating and, consequently, also the phase relationship of the laser radiation field which passes through this section.

Figure 8:
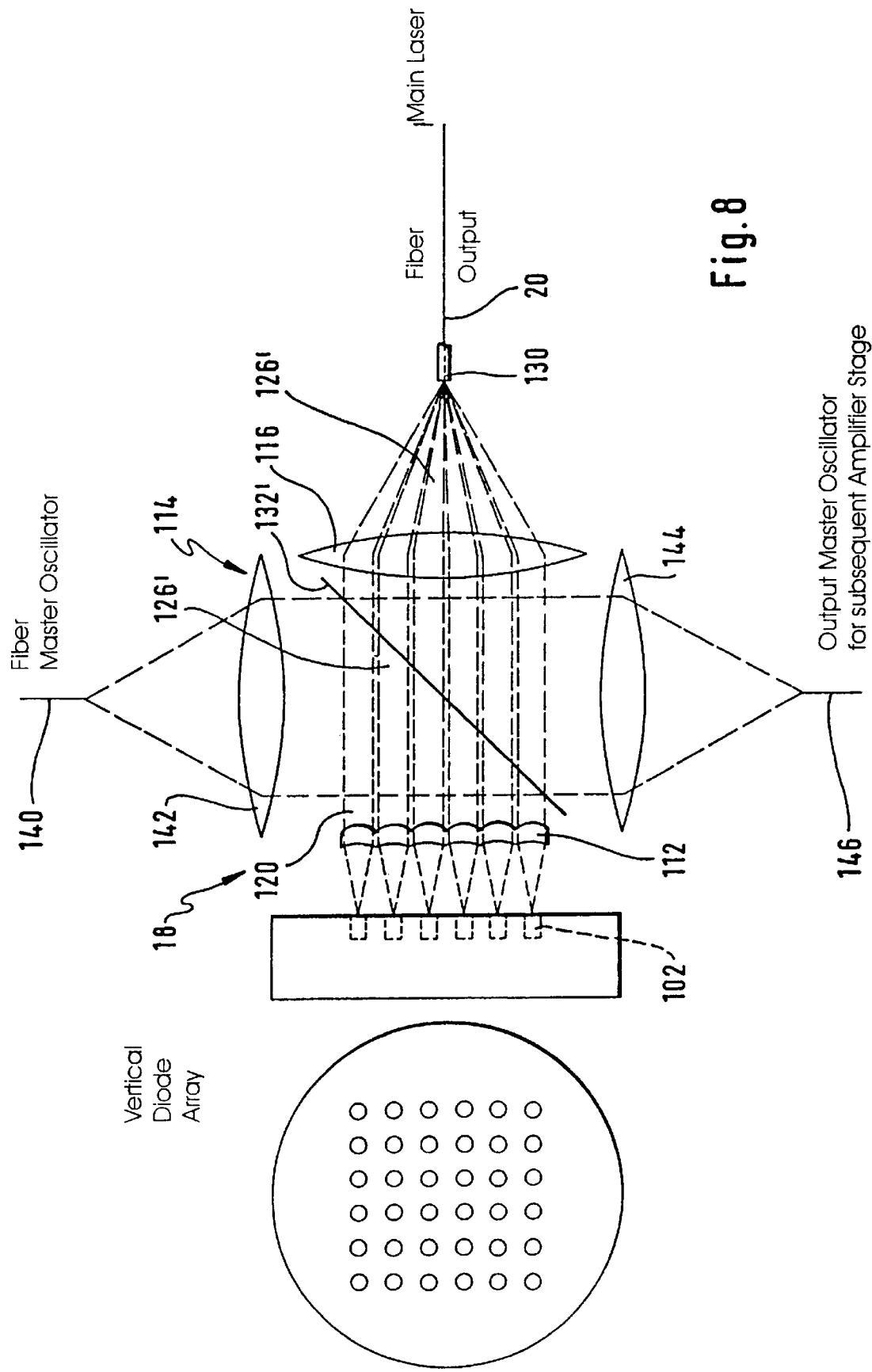
FIG. 8 shows a first variation of the first embodiment of an inventive subsystem.

In a first variation of the first embodiment of an inventive subsystem, illustrated in FIG. 8, the beam splitter 132' is not arranged between the second end 130 and the second element 116 of the optical imaging means 114 but between the first element 112 and the second element 116 and so the beam splitter 132' is penetrated by all the individual laser radiation fields 120 extending parallel to one another. The master laser radiation reflected by the beam splitter 132' in the direction of the vertical emitters 102 now leads to the vertical emitters 102 operating, on the one hand, at exactly the same wavelength in the manner already described and, on the other hand, each with a relative phase relationship which takes into account the phase changes of the first element of the optical imaging means 114 so that the individual laser radiation fields 120 propagate essentially in phase with one another after passing through the first element 112 of the optical imaging means 114 and, following the first element 112 of the optical imaging means 114, already form a coherent laser radiation field which is then focused onto the second end 130 of the single mode fiber by means of the second element 116.

This solution may be used when the influence of the second element 116 of the optical imaging means 114 on the respective individual laser radiation fields 120 does not result in any relative shift in the phase relationship between individual laser radiation fields 120 and thus the coherence of the laser radiation field 126' is likewise maintained after passing through the second element 116 and thus coherent laser radiation 126 enters the single mode fiber 20.

The advantage of the first variation of the first embodiment according to FIG. 8 is to be seen in the fact that, for example, the master radiation field may be supplied via a light guide 140 to the respective subsystem 18 and expanded via an optical expansion means 142 such that the beam splitter 132' reflects the master laser radiation to each of the vertical emitters 102 of the subsystem 18. The master laser radiation passing through the beam splitter 132' can be focused again into an additional light guide 146 by means of an optical focusing means 144 in order to supply this radiation to an additional subsystem.

Figure 9:
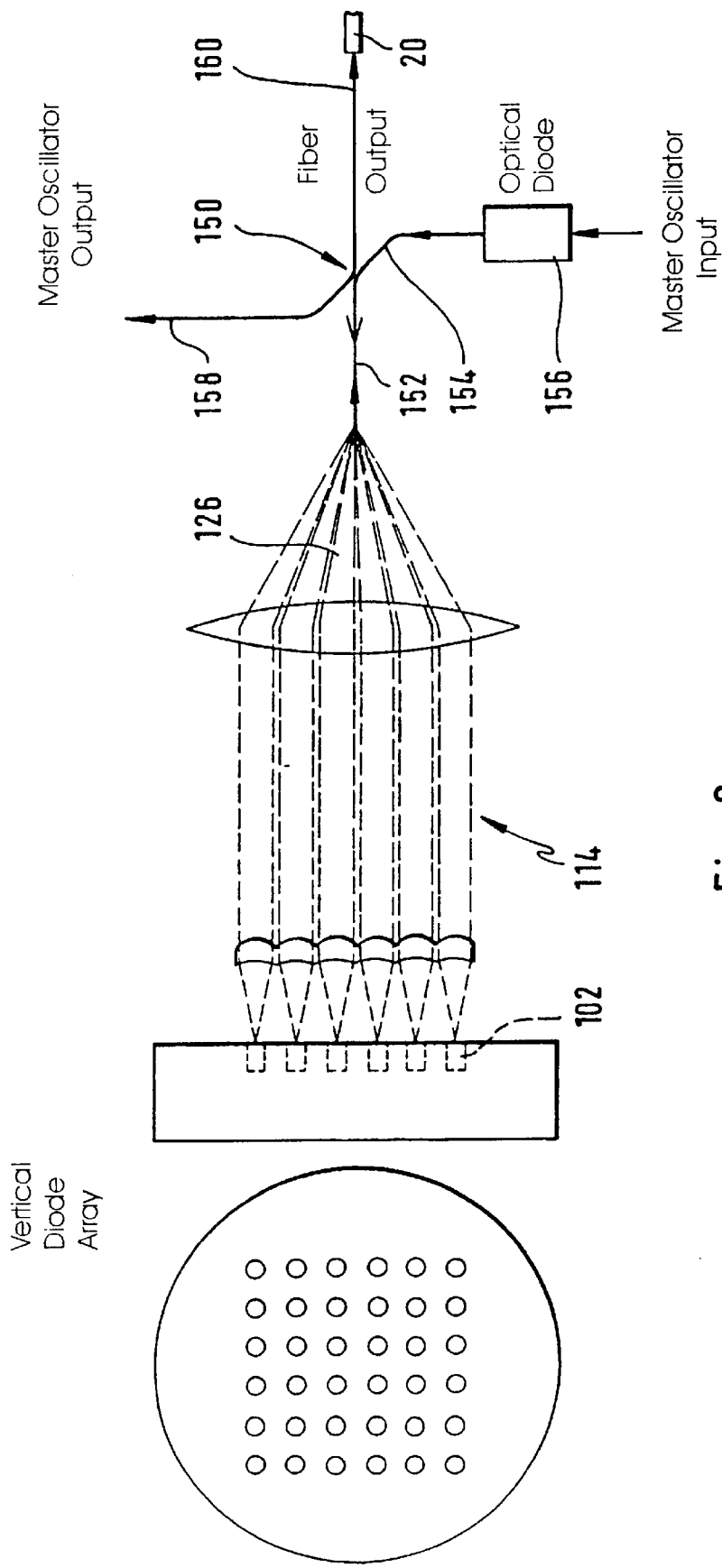
FIG. 9 shows a second variation of the first embodiment of an inventive subsystem.

In a second variation of the first embodiment, illustrated in FIG. 9, a beam splitter is not provided as coupling-in element but rather the coupling-in element is designed as a waveguide coupler 150 which can be designed either as a fiber coupler or as a waveguide structure arranged in a substrate.

Such a waveguide coupler 150 has a first input, into which the laser radiation field 126 is coupled by means of the optical imaging means 114, and a second input 154, into which the master laser radiation is coupled via an optical diode 156. The waveguide coupler 150 is thereby constructed such that the master laser radiation coupled in via the second input 154 is partially coupled over to the first input 152 and from there extends through the optical imaging means 114 in the direction of the vertical emitters 102 in order to keep the vertical emitters 102 at exactly the same wavelength and phase-balanced relative to one another, wherein all the phase changes which result due to the optical imaging means 114 are taken into account in the relative phase relationship of the vertical emitters 102 so that the individual laser radiation from all the vertical emitters 102 results, in the end, after passing through the optical imaging means 114 in the coherent laser radiation field which can be coupled into the first input 152 of the waveguide coupler 150.

The waveguide coupler 150, in addition, couples the master laser radiation on to a first output 158 and the laser radiation field 126 coupled into the first input 152 essentially to a second output 160 which is, for its part, coupled to the single mode fiber 20.

Thus, the second variation according to FIG. 9 operates, in principle, in the same way as the first embodiment according to FIG. 6 and compensates all the phase changes caused by the optical imaging means 114.

Figure 10:
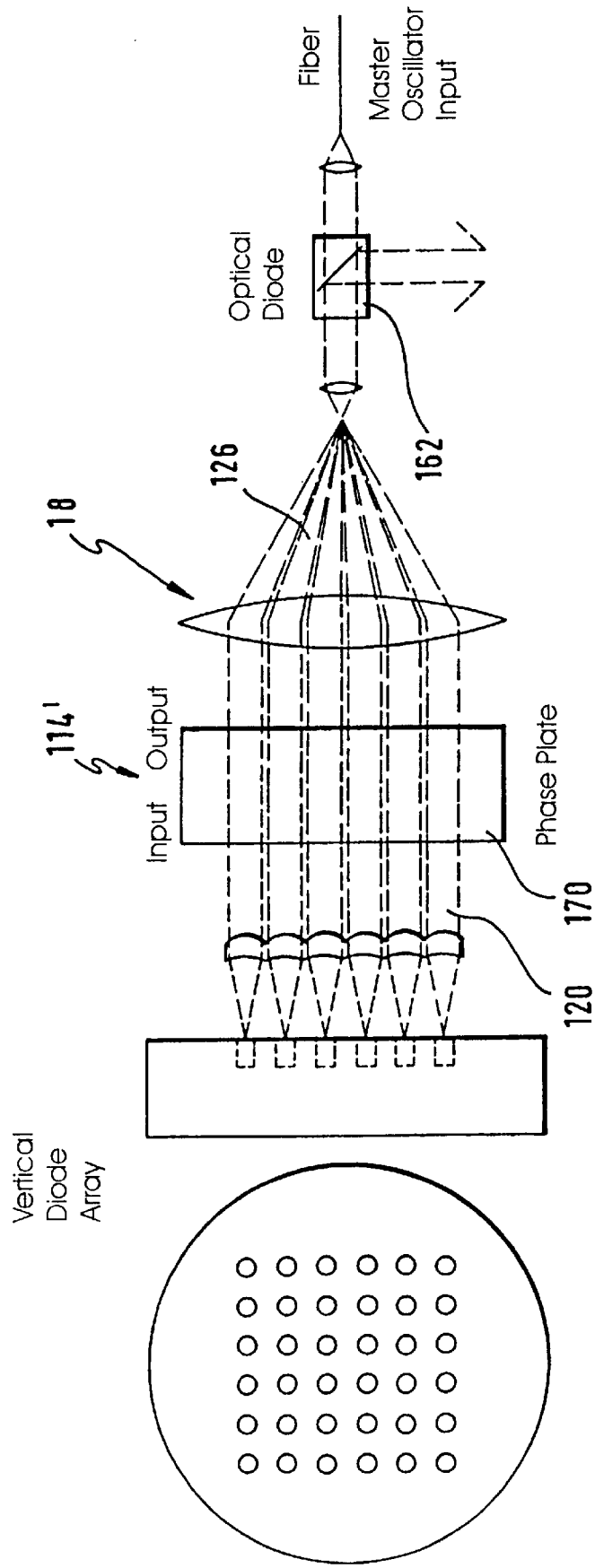
FIG. 10 shows a third variation of the first embodiment of an inventive subsystem.
Figure 11:
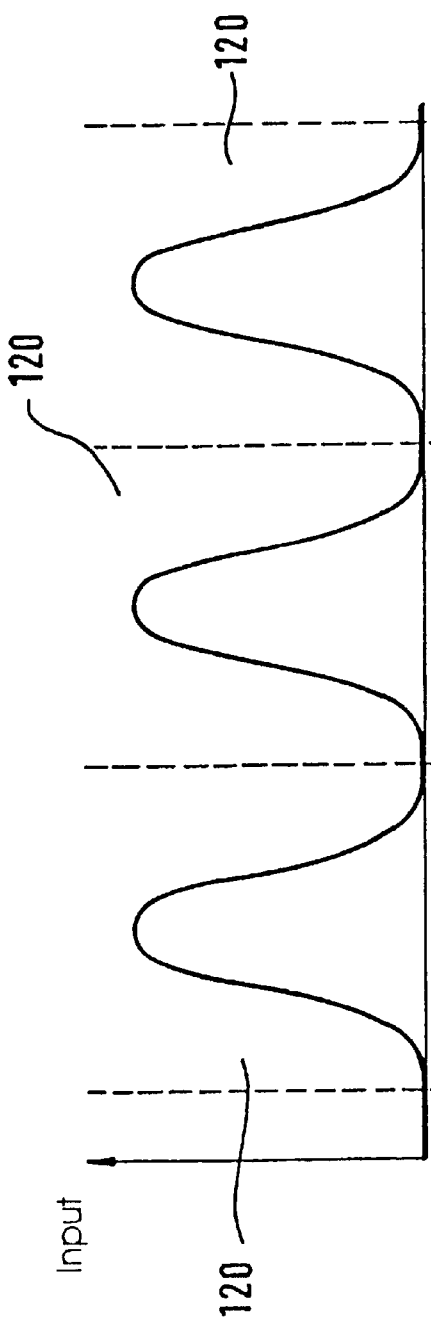
FIG. 11 shows an illustration of the intensity distribution of an incoming wave front in the individual laser radiation fields, plotted over their cross section prior to entering the phase plate.

In a third variation of the first embodiment of an inventive subsystem, illustrated in FIG. 10, the master laser radiation is coupled in via an optical diode 160 which is arranged to follow the optical imaging means 114 and essentially has a beam splitter 162 which has the master laser radiation radiating through it in a straight line and, on the other hand, reflects the laser radiation field 126 transversely to its incoming direction in the direction towards the single mode fiber 20.

Figure 12:
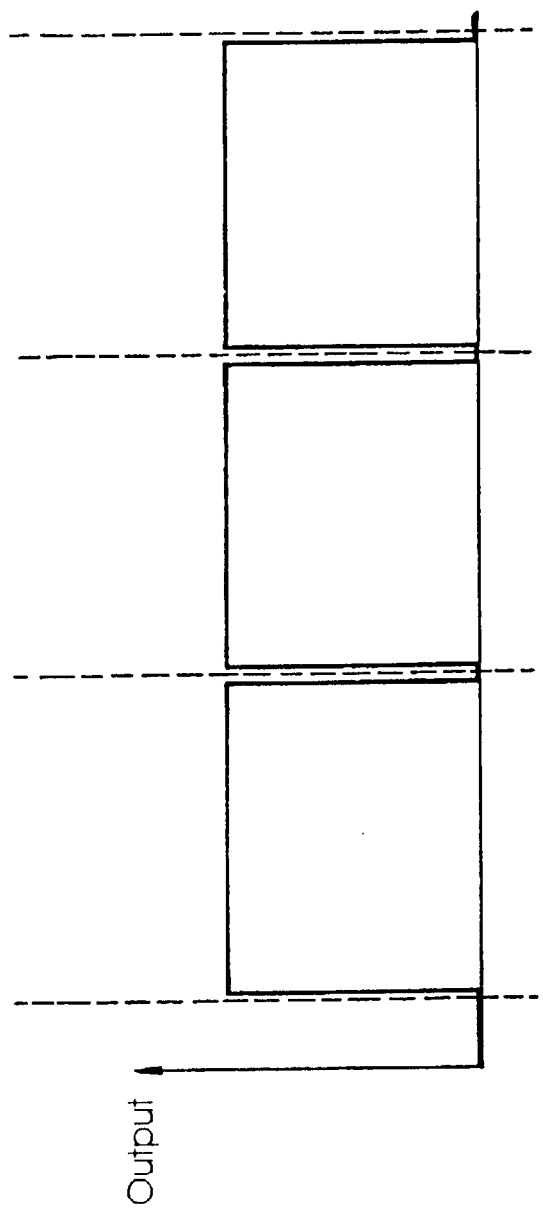
FIG. 12 shows the illustration of the intensity distribution in accordance with FIG. 11 after passing through the phase plate.

Furthermore, the optical imaging means 114' is provided, in addition, with a phase plate 170 which, in the case of the individual laser radiation fields 120, results in a distribution of the intensity, which is inherent in these fields and is Gaussian over the cross section of each individual laser radiation field 120, being converted into an essentially rectangular distribution of the intensity, illustrated in FIG. 12, over the cross section of the respective individual laser radiation field 120.

Figure 13:
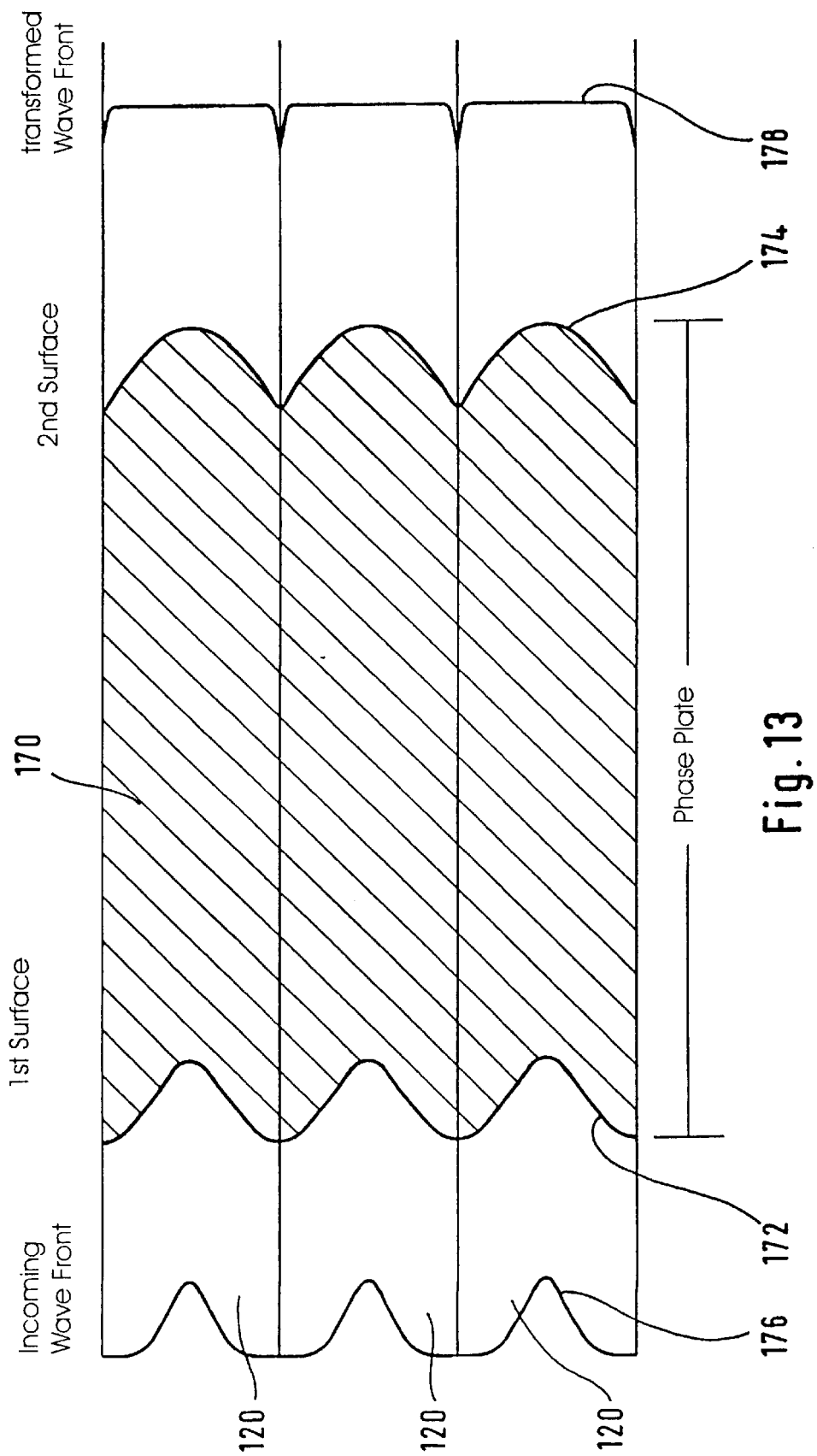
FIG. 13 shows a principle illustration of a construction of an inventive phase plate with illustration of the intensity distribution of an incoming wave front and illustration of the intensity distribution of this wave front after passing through the phase plate.

Such a phase plate 170 is illustrated schematically in FIG. 13 and has for each of the individual laser radiation fields 120 on the input side a beam-expanding surface shape 172 and on the output side a focusing surface shape 174 which can be coordinated with one another with respect to their curvature and their spacing such that an essentially rectangular intensity distribution of a transformed wave front 178 results from the Gaussian intensity distribution of an incoming wave front 176.

Figure 14:
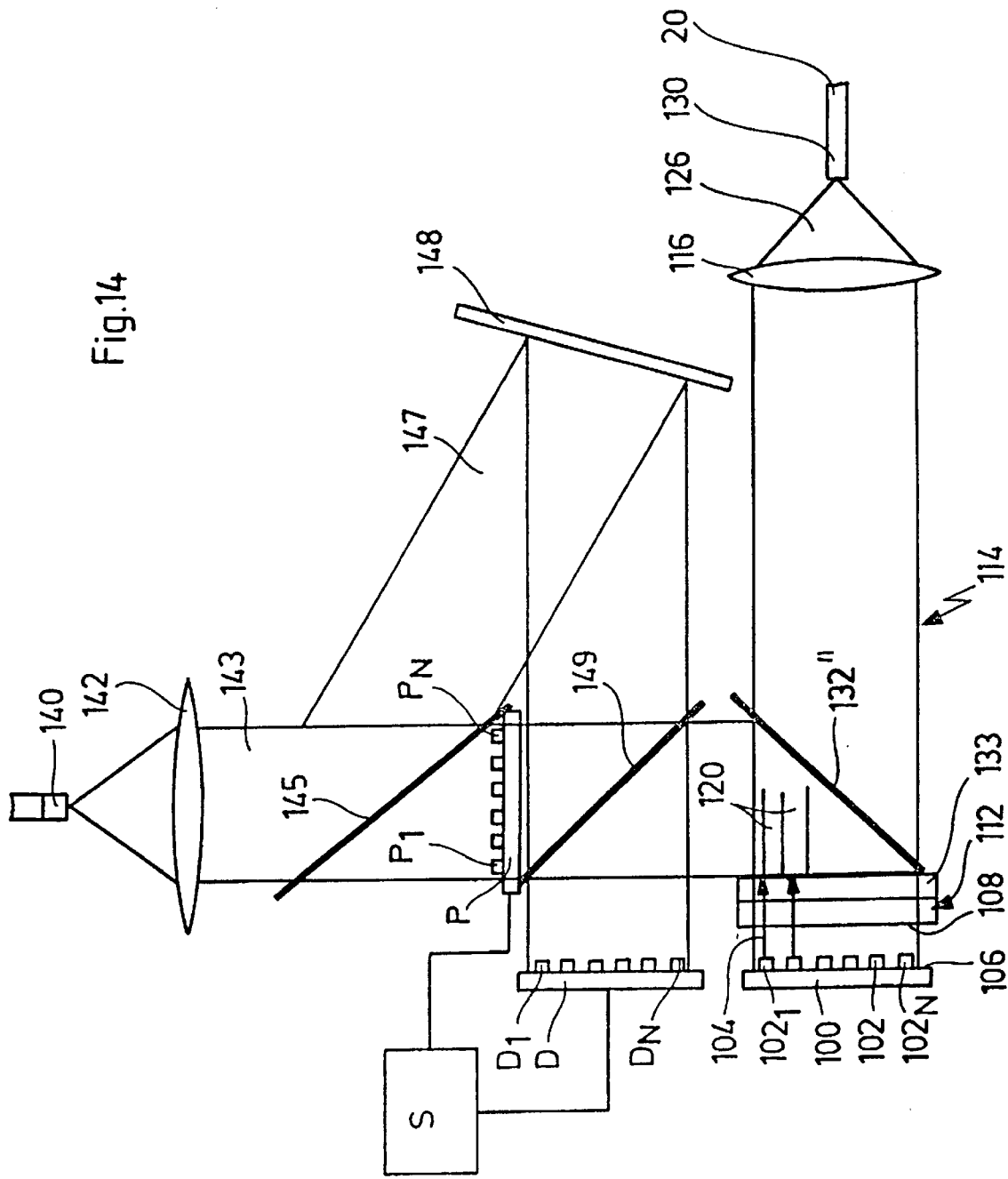
FIG. 14 shows a fourth variation of the first embodiment of an inventive subsystem.

In a fourth variation of the first embodiment of an inventive subsystem, illustrated in FIG. 14, the vertical emitters 102 are likewise provided on a substrate 100 and emit in the direction 104 which extends approximately at right angles to the plane 106.

The individual laser radiation 111 of the vertical emitters 102 is likewise reflected by the extreme reflector 108 of the element 112 which is designed in the same manner as in the first embodiment so that the individual radiation fields 120 of the vertical emitters 102 are located as close as possible to one another, exactly as in the first embodiment, and propagate parallel to one another, namely in the direction of the second optical element 116 which focuses the individual laser radiation fields 120 onto the second end 130 of the single mode fiber 20 belonging to this subsystem and couples the coherent laser radiation field 126 into the single mode fiber 20.

The individual laser radiation fields 120 thereby penetrate a beam splitter 132" which is arranged between the first element 112 and the second element 116 of the optical imaging means 114 and couples master laser radiation coming from the master oscillator 86 and supplied via the light guide 140 into the individual vertical emitters 102, wherein the master laser radiation is thereby expanded via the optical expansion means 142 to form a master laser radiation field 143.

Prior to impinging on the beam splitter 132", this master laser radiation field 143 impinges on a beam splitter 145 which couples out a small part of the master laser radiation field 143 as reference laser radiation field 147 and reflects it onto a mirror 148 which, for its part, then reflects the reference laser radiation field 147 onto a detector array D which has a plurality of detector elements $D_1$ to $D_N$ which corresponds to the plurality of vertical emitters $102_1$ to $102_N$ and is arranged in the same manner as these.

The reference laser radiation field 147 reflected by the mirror 148 passes, for its part, through a beam splitter 149 again which is, itself, also penetrated by the master laser radiation field 143 on its way to the beam splitter 132" and is designed such that it reflects parts of the individual laser radiation fields 120 reflected back by the beam splitter 132" likewise onto the detector array D so that not only the reference laser radiation field 143 impinges on the detector array D but also a small part of the intensity of the individual laser radiation fields 120 and thus the individual detectors $D_1$ to $D_N$ of the detector array D are in a position to ascertain for each individual laser radiation field 120 a difference in phase between this and the part of the master laser radiation field 143 which impinges on the corresponding vertical emitter 102 and forms the reference laser radiation field.

In order to correct any such difference in phase between the respective part of the master laser radiation field 143 and the individual laser radiation field 120, the master laser radiation field 143 penetrates, prior to impinging on the beam splitter 132", a phase correction plane P which has a plurality of individual phase control elements $P_1$ to $P_N$ which are arranged in the same manner as the respective vertical emitters $102_1$ to $102_N$ and the corresponding detector elements $D_1$ to $D_N$.

It is now possible to adjust the phase relationship of the corresponding part of the master laser radiation field 143 via each of the individual phase control elements $P_1$ to $P_N$ via a control S in such a manner that all the vertical emitters 102 generate individual laser radiation fields 120, which have the same phase relationship relative to one another, as a result of corresponding adjustment of the phase of the parts of the master laser radiation field 143 acting on them.

Particularly favorable results can, however, be achieved when the beam splitter 132" is a polarizing beam splitter and a polarization adjustment element 133 is provided between the beam splitter and the first element 112, this polarization adjustment element carrying out a polarization rotation through $\lambda/4 \pm \epsilon$ so that essentially the entire individual laser radiation fields 120 generated by the vertical emitters 102 pass through the beam splitter 132 after passing once more through the polarization adjustment element 133, and only a part of the intensity of the individual laser radiation fields 120 which corresponds to the error rotation $\epsilon$ is reflected from the beam splitter 132" to the beam splitter 149 and thus to the detector array D.

Figure 15:
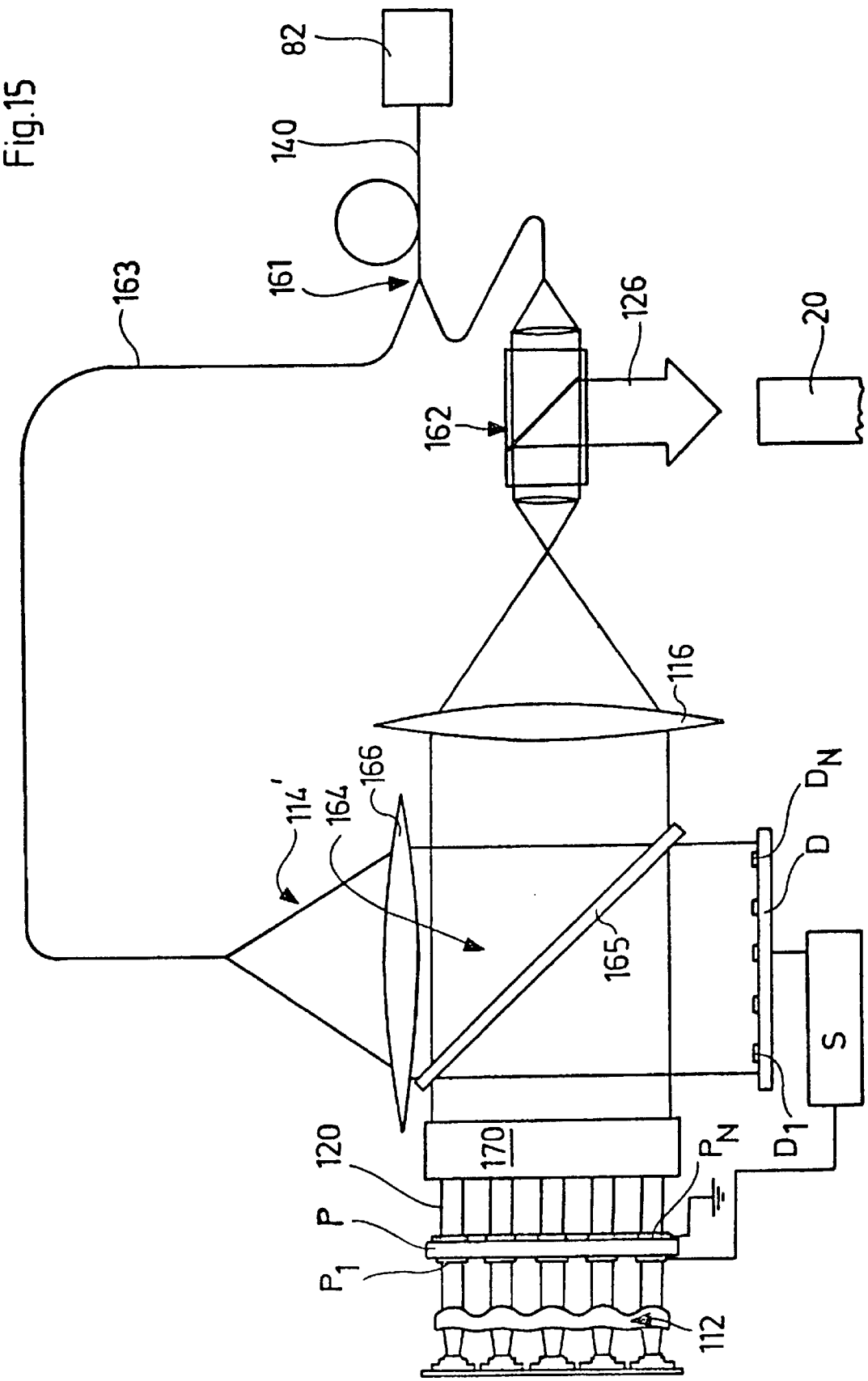
FIG. 15 shows a fifth variation of the first embodiment of an inventive subsystem.

A fifth variation of the first embodiment, illustrated in FIG. 15, is close to the third variation according to FIG. 10 with respect to the construction in principle. In contrast to the third variation, however, part of the master laser radiation is coupled out from the light guide 140 via a coupling-out element 161 before the optical diode 160 and supplied to the detector array D with the detectors $D_1$ to $D_N$ via a light guide 163 as reference laser radiation 164.

The detector array D is thereby arranged such that part of the intensity of the individual laser radiation fields 120 is supplied to it via a beam splitter 165. The reference laser radiation also preferably passes through the beam splitter 165 and is expanded beforehand by an expansion element 166 to form a reference laser radiation field 164 which acts on all the detector elements $D_1$ to $D_N$ of the detector array D.

Furthermore, the phase correction plate P is, for example, arranged between the phase plate 170 and the first element 112 of the optical imaging means 114' and is in a position with its individual phase control elements $P_1$ to $P_N$ to correct the phase relationship of each individual laser radiation field 120, namely in accordance with a phase relationship of the individual laser radiation fields 120 relative to one another which has been ascertained by the control S by means of the detectors $D_1$ to $D_N$.

A constant readjustment of the phase relationship of each individual laser radiation field 120 relative to the others is thus possible in the fifth variation of the first embodiment as well, as illustrated in FIG. 15, and so a coherent laser radiation field 127 can be coupled altogether into the single mode fiber 20.

In the fourth and fifth variations, the phase correction plate P is preferably formed from an electro-optical crystal which, for the formation of the phase control elements $P_1$ to $P_N$, is provided with individual electrodes which can be controlled individually by the control so that a separate phase adjustment is possible by means of the control S for each individual part of the master laser radiation field guided to the individual vertical emitters 102.

As for the rest, those elements which are identical have been given the same reference numerals in all the variations of the first embodiment and so with respect to their description in detail reference is made to the first comments on them in conjunction with the first embodiment.

Furthermore, the first embodiment of an inventive subsystem 18 is not limited to the use of vertical emitters 102 as semiconductor lasers. In the same way, edge emitters stacked one on top of the other can be used in the first embodiment, their exit surfaces 112 being located in a plane such that the individual laser radiation exits from this plane, preferably vertically to this plane.

Figure 16:
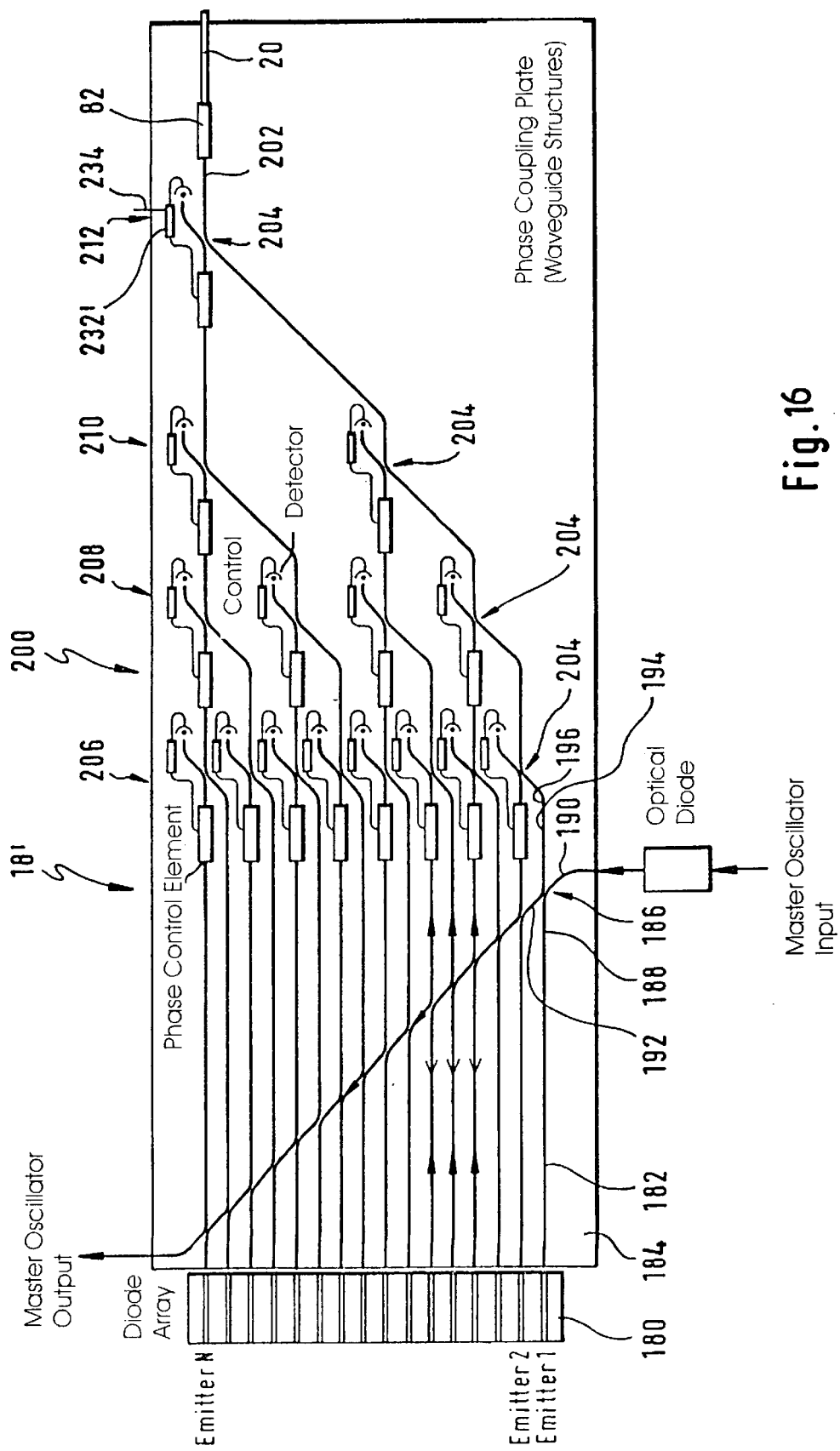
FIG. 16 shows a schematic illustration of a second embodiment of an inventive subsystem.

In a second embodiment of an inventive subsystem 18', illustrated in FIG. 16, a plurality of edge emitters 180 which are arranged in a row next to one another are used as semiconductor lasers.

The individual laser radiation generated by each of these semiconductor lasers operating as edge emitters 180 is coupled into a respective first waveguide 182, wherein the number of first waveguides 182 corresponds to the number of edge emitters 180.

The first waveguide 182 is preferably designed as a waveguide structure in a substrate 184, wherein the substrate 184 supports all the waveguide structures 182 of the subsystem 18'.

These first waveguide structures 182 guide the individual laser radiations from each of the edge emitters 180 to a respective coupling-in element 186 which is likewise designed as a waveguide structure on the substrate 184. The coupling-in element 186 is designed as a waveguide coupler and has a first input 188, through which the individual laser radiation from the respective edge emitter 180 is coupled in, and a second input 190, through which the master laser radiation is coupled in. The coupling-in element 186 is thereby designed such that a portion of the master laser radiation coupled in through the second input 190 is coupled to the first input 188 and guided to the respective edge emitter 180 via the respective first waveguide structure 182. Furthermore, the coupling-in element 186 has a first output 192, from which the master laser radiation not coupled to the edge emitter 180 exits, and a second output 194, from which essentially the individual laser radiation of the edge emitter 180 exits.

Thus, a coupling-in element 186 for master laser radiation is provided on the substrate 184 for each edge emitter 180, wherein all the coupling-in elements 186 for all the edge emitters 180 are connected to one another in such a manner that the first output 192 of the one coupling-in element 186 is coupled to the second input 190 of the next following coupling-in element 186 so that the master laser radiation can be coupled into each individual edge emitter 180 via the first waveguide structure 182 coupled to the respective coupling-in element 186.

A second waveguide 196, which is likewise designed as a waveguide structure on the substrate 184, then leads from the first output 194 of the respective coupling-in element 186 to a coupling device which is designated as a whole as 200 and couples all the second waveguide structures 196 into an output waveguide 202, and preferably'such that in the output waveguide 202 the individual laser radiation supplied to the coupling device 200 via each of the second waveguide structures 196 is superposed in phase with all the others so that in the output waveguide 202 a coherent laser radiation field is present which corresponds to the inphase superposition of all the individual laser radiations of all the edge emitters 180 of the subsystem 18'.

The coupling device 200 thereby comprises a cascade structure of individual coupling elements 204, wherein in a first stage 206 each individual coupling element 204 combines the individual laser radiation from two second waveguide structures 194 in phase with one another. In a second stage 208, each of the coupling elements 204 then combines the laser radiation, which is already combined in phase, from two respective coupling elements 204 of the preceding stage 206. In the same way, each of the coupling elements 204 of the next following stage 210 again couples the laser radiation, which is already coupled in phase, from two respective coupling elements 204 of the preceding stage 208 for such a time until in the last stage 212 the single coupling element 204 combines the laser radiations of the coupling elements 204 of the preceding stage 210 which are combined in phase and thus couples into the output waveguide 202 the superposition combined in phase of all the individual laser radiations of all the edge emitters 180.

Figure 17:
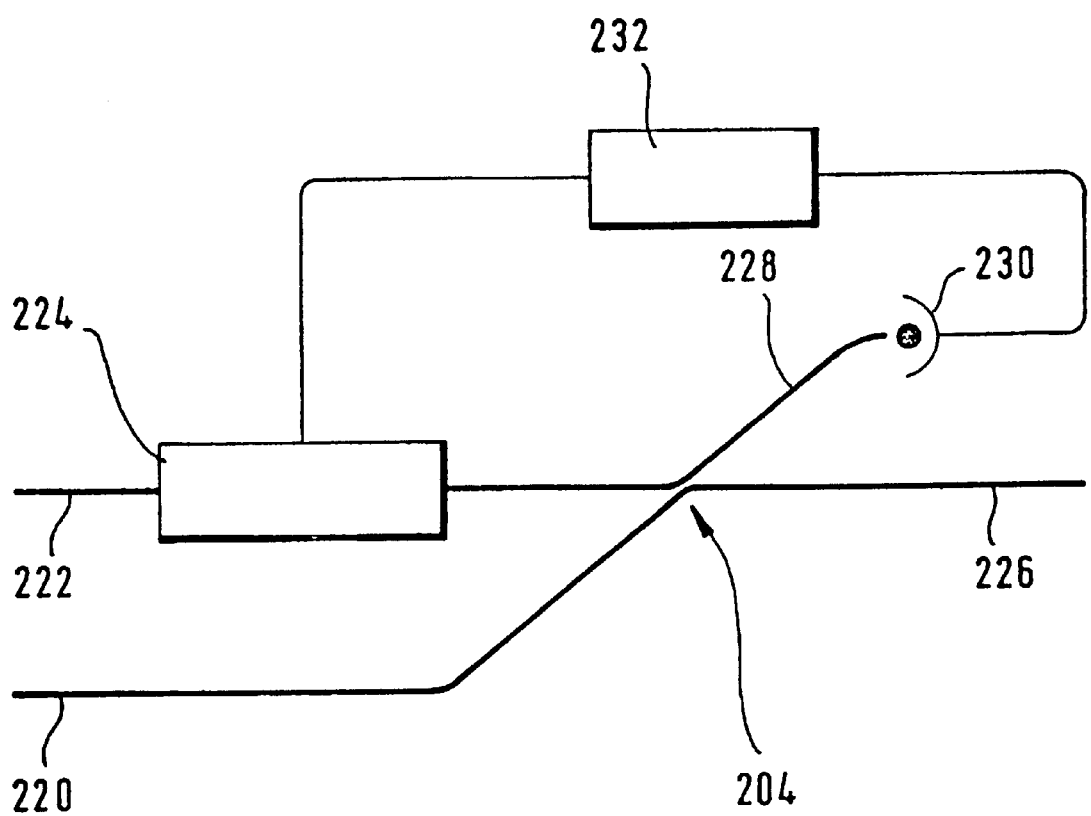
FIG. 17 shows an enlarged illustration of a coupling element of the second embodiment of an inventive subsystem.

In order to bring about an inphase coupling in the individual coupling elements 204, each individual coupling element 204 comprises, as illustrated on a larger scale in FIG. 17, a first input 220 and a second input 222. The second input 222 is provided with a phase control element 224. The coupling element 204 is, in addition, constructed such that this is in a position to couple the laser radiation coupled into the first input 220 and the second input 222 onto a first output 226 in an inphase manner so that coherent laser radiation can be coupled out at this output with the sum of the intensities of the laser radiation 220 and 222 whereas no laser radiation can be coupled out at a second output 228. In the case of a coupling element designed in this manner, the second output 228 is therefore provided with a detector for the laser radiation 230, and this detector 230 is coupled to a control 232 which controls the phase control element 224. The control 232 is thereby designed such that it always controls the phase control element 224 such that the detector 230 at the second output 228 does not detect any laser radiation. In this case, the sum of the laser radiation coupled in at the inputs 220 and 222 can automatically be coupled out in inphase superposition at the first output 226 in the case of a coupling element 204 constructed in this manner.

If the coupling element 204 is arranged in the form of a waveguide structure on the substrate 184, the phase control element 224 can also preferably be realized in a simple manner on the substrate 184 when the substrate 184 is constructed from an electro-optical material or a semiconductor material. In the case of a semiconductor material, the detector 230 and the control 232 can also preferably be realized on the substrate.

In order to have the additional possibility of controlling the laser radiation field exiting from the last stage 212, it is preferably provided for its coupling element 204 to have a control 232' which comprises, in addition, a control input 234, via which an additional access is possible in order to control the phase control element 224 thereof externally, for example, such that the inphase superposition of the laser radiation coupled in via the inputs 220 and 222 is present at the second output 228 of the coupling element 204 of the last stage 212. In this case, no laser radiation exits at the first output 226. Optional superpositions of the laser radiations coupled in at the inputs 220 and 222 may, however, also be generated via the control input 234 so that any optional modulation of the laser radiation which can be coupled out at the first output 226 is possible.

The laser radiation exiting via the output waveguide 202 is then coupled into the phase adjusting means 82 which can be controlled in the manner described by the control 32. The phase adjusting means 82 can, in the simplest case, likewise be realized as a phase control element on the substrate 184 so that the laser radiation of the subsystem 18' is coupled into the single mode fiber 20 associated with it following the phase adjusting means 82.

No details concerning the design of the master semiconductor laser systems 90 of the master laser radiation generator 84 have been given in conjunction with the preceding description of the individual embodiments.

For reasons of simplicity, it is possible to construct these master semiconductor laser systems 90 in an identical way to the subsystems 18 or 18' and to use the laser radiation field generated by them for coupling into the single mode fiber 20 as master laser radiation for additional master semiconductor laser systems or as master laser radiation for the subsystems 18 or 18'.

In this case, the laser radiation field generated by the respective master laser radiation system is to be divided again via a beam splitter in order to be used as additional master laser radiation.

Figure 18:
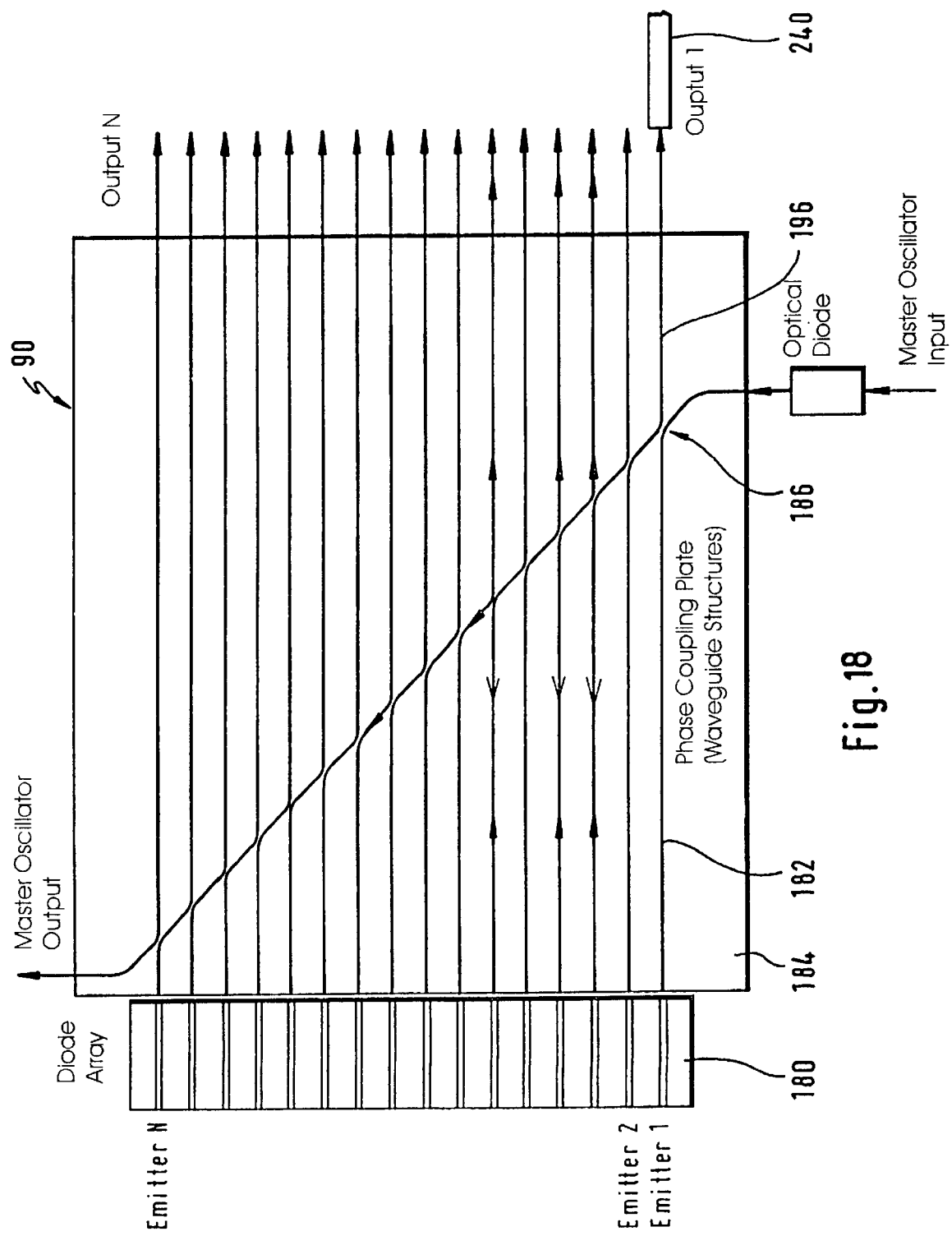

A simplified embodiment of an inventive master semiconductor laser system 90, illustrated in FIG. 18, likewise has, like the second embodiment of the inventive subsystem, a row of edge emitters 180, the individual laser radiation of which can be coupled into first waveguide structures 182 arranged on a substrate 184, wherein the first waveguide structures 180 are connected to coupling-in elements 186, from which the second waveguide structures 196 then lead away.

Each of these second waveguide structures is then led separately, for example, by means of a waveguide 240 either to the next following master semiconductor laser system 90 as master laser radiation or to one of the subsystems 18 or 18'.

With respect to the design of the coupling-in elements 186 as well as the coupling of all the coupling-in elements 186, reference is made in full to the explanations concerning the second embodiment of the inventive subsystem, illustrated in FIG. 16.

In this case, the individual laser radiation generated by each edge emitter is phase-balanced in relation to the individual laser radiation of all the edge emitters of the master semiconductor laser system 90 or the basic master laser 86 on account of the master laser radiation coupled in, but not necessarily in phase. Such a phase-balanced relation of the phase relationship is sufficient to use the individual laser radiation of each individual edge emitter again as master laser radiation, wherein the master laser radiation coupled out of a second waveguide structure 196 likewise has a locked phase relationship relative to the master laser radiation of another second waveguide structure 196 of the master semiconductor laser system 90 and the phase relationship need not be identical. Furthermore, the wavelength of the master laser radiation in each of the second waveguide structures 196 is the same since the master laser radiation coupled in via the coupling-in elements 186 causes all the edge emitters 180 to operate at exactly the same wavelength.

A further, alternative solution of an inventive master laser radiation generator, illustrated in FIG. 19, is based on the use of subsystems in accordance with the first embodiment. In this case, a master semiconductor laser system 90, which is designed in accordance with the first variation of the first embodiment of the inventive subsystem, illustrated in FIG. 8, is supplied with master laser radiation via the basic master laser 86 formed by a single semiconductor laser. In contrast to the first variation illustrated in FIG. 8, the second element 116 is left out in the optical imaging means 114 and so this merely has the first element 112 so that the individual radiation fields 242 generated by the master semiconductor lasers 88 propagate parallel to one another and penetrate a first beam splitter 244 serving to couple in the master laser radiation and impinge on a series of further beam splitters 246$_1$ to 246$_Y$ which serve to couple the individual laser radiation fields 242 into master semiconductor laser systems 90'$_1$ to 90'$_Y$ again which, for their part, likewise generate master laser radiation with an optical imaging means 114 without the second element 116, wherein the master laser radiation of the master semiconductor laser system 90'$_1$ can, for example, be coupled into several subsystems 18 designed according to the first variation of the second embodiment with the respective beam splitter 132', wherein these subsystems 18 then generate a laser radiation field 126 which can be coupled into the single mode fiber.

What is claimed is:

1. A laser system comprising a fiber bundle consisting of single mode fibers each having a first end, said first ends together forming a fiber bundle end from which a total radiation field formed from laser radiation exiting from the first ends of the fibers can exit, said total radiation field being adapted to be imaged onto a target surface, and each of said single mode fibers being coupled via a second end thereof to a respective subsystem adapted to generate the laser radiation, wherein:
    each subsystem comprises a plurality of semiconductor lasers operating in parallel,
    within each subsystem, all of the semiconductor lasers operate with the same wavelength in a phase-balanced manner in relation to one another as a result of master laser radiation coupled into them, said master laser radiation being adapted to be coupled into the semiconductor lasers through an output side thereof, and
    individual laser radiation exiting from the individual semiconductor lasers of each subsystem is combinable, by means of a coupling device of that subsystem, to form a coherent laser radiation field adapted to be coupled into the single mode fiber associated with the respective subsystem.

2. A laser system as defined in claim 1, wherein the master laser radiation is adapted to be coupled into the semiconductor lasers via a coupling-in element of the respective subsystem penetrated by the individual laser radiation.

3. A laser system as defined in claim 1, wherein the master laser radiation is adapted to be coupled into the semiconductor lasers via a coupling-in element of the respective subsystem penetrated by the coherent laser radiation field.

4. A laser system as defined in claim 1, wherein the coupling device unites the individual laser radiation by means of an optical imaging means to form the coherent laser radiation field adapted to be coupled into the single mode fiber.

5. A laser system as defined in claim 4, wherein the optical imaging means forms from the individual laser radiation individual laser radiation fields propagating parallel to one another and each having essentially plane wave fronts.

6. A laser system as defined in claim 4, wherein the optical imaging means focuses all the individual laser radiation fields of a subsystem into the single mode fiber provided therefor.

7. A laser system as defined in claim 4, wherein the master laser radiation is adapted to be coupled into the semiconductor laser via the individual laser radiation fields.

8. A laser system as defined in claim 4, wherein the master laser radiation is adapted to be coupled into the semiconductor laser via a coupling-in element of the respective subsystem penetrated by all the individual laser radiation fields.

9. A laser system as defined in claim 4, wherein the master laser radiation is adapted to be coupled into the semiconductor lasers via a coupling-in element of the respective subsystem arranged between the optical imaging means and the single mode fiber.

10. A laser system as defined in claim 4, wherein the optical imaging means comprises a phase plate effecting the even distribution of the intensity with essentially a plane wave front over a cross section of the respective individual laser radiation field.

11. A laser system as defined in claim 1, wherein the master laser radiation is adapted to be coupled into the semiconductor lasers via a coupling-in element formed from waveguides.

12. A laser system as defined in claim 1, wherein the master laser radiation is adapted to be coupled into the semiconductor lasers via an optical diode as a coupling-in element of the respective subsystem.

13. A laser system as defined in claim 1, wherein:
    the individual semiconductor lasers of each subsystem are operated in a frequency and phase defined manner with a respective part of the master laser radiation; and
    the part respectively coupled into one of the semiconductor lasers penetrates a phase control element of the subsystem.

14. A laser system as defined in claim 13, wherein the phase control elements are arranged outside the individual laser radiation fields.

15. A laser system as defined in claim 14, wherein the phase control elements adjust phase relationships in the individual parts of the master laser radiation prior to their superposition with the individual laser radiation fields.

16. A laser system as defined in claim 13, wherein each phase control element is controlled in a defined manner by a control.

17. A laser system as defined in claim 16, wherein the control detects a relative phase relationship of the individual laser radiation fields relative to one another by means of detector elements associated with the individual laser radiation fields.

18. A laser system as defined in claim 16, wherein the control detects the relative phase relationship of the individual laser radiation fields as a result of superposition thereof with a reference laser radiation.

19. A laser system as defined in claim 18, wherein the reference laser radiation is formed by a coupled-out part of the master laser radiation.

20. A laser system as defined in claim 1, wherein the semiconductor lasers of the subsystem are arranged to follow one another in one direction.

21. A laser system as defined in claim 1, wherein the semiconductor lasers of the subsystem are arranged in one surface.

22. A laser system as defined in claim 21, wherein the semiconductor lasers of the subsystem are arranged in the surface in a defined surface pattern.

23. A laser system as defined in claim 1, wherein the semiconductor lasers of the respective subsystem have an external coupling-out mirror.

24. A laser system as defined in claimed 23, wherein the semiconductor lasers are provided with a concave coupling-out mirror.

25. A laser system as defined in claim 23, wherein the coupling-out mirror is arranged on the entry side of the optical imaging means.

26. A laser system as defined in claim 25, wherein the coupling-out mirror is designed as a coating on one element of the optical imaging means.

27. A laser system as defined in claim 1, wherein the individual laser radiation propagates freely in the space, influenced by optical imaging means.

28. A laser system as defined in claim 1, wherein the individual laser radiation of each semiconductor laser is adapted to be coupled into a first waveguide comprising a waveguide structure on a support.

29. A laser system as defined in claim 28, wherein the first waveguides of several semiconductor lasers are arranged on a common support.

30. A laser system as defined in claim 29, wherein the first waveguides for the individual laser radiation of all the semiconductor lasers of an individual subsystem are arranged on a common support.

31. A laser system as defined in claim 28, wherein the first waveguides guide the individual laser radiation into a coupling-in element that couples:
  (i) the individual laser radiation further into a second waveguide leading to the single mode fiber and,
  (ii) the master laser radiation into the first waveguides.

32. A laser system as defined in claim 31, wherein the second waveguides are designed as a waveguide structure on a support.

33. A laser system as defined in claim 28, wherein the coupling-in elements are arranged as waveguide structures on a support.

34. A laser system as defined in claim 33, wherein all the coupling-in elements of the respective subsystem are arranged on a common support.

35. A laser system as defined in claim 1, wherein the coupling device is arranged between the second waveguides and the single mode fiber.

36. A laser system as defined in claim 35, wherein the coupling device comprises coupling elements each having two inputs and at least one output and that the radiations entering at the inputs are superposed at the respective output.

37. A laser system as defined in claim 36, wherein each of the coupling elements is provided with a phase control element in order to superpose the laser radiations propagating in the two respective waveguide structures in a phase-defined manner in the coupling element.

38. A laser system as defined in claim 37 wherein:
  each of the coupling elements has two inputs and two outputs, and
  a radiation detector is arranged at one of the outputs for controlling the phase control element.

39. A laser system as defined in claim 36, wherein the coupling elements are arranged as waveguide structures on the support.

40. A laser system as defined in claim 1, wherein the master laser radiation for all the subsystems is adapted to be generated by a master laser radiation generator.

41. A laser system as defined in claim 40, wherein the master laser radiation generator operates all the subsystems with the same wavelength and in a phase-balanced manner relative to one another.

42. A laser system as defined in claim 40, wherein the master laser radiation generator supplies each of the subsystems with master laser radiation derived from a single basic master laser radiation.

43. A laser system as defined in claim 42, wherein the master laser radiation generator is designed as a master laser radiation cascade.

44. A laser system as defined in claim 43, wherein the master radiation cascade has a basic master laser and master semiconductor laser elements of a master semiconductor laser system, said laser elements operating via the basic master laser radiation of said basic master laser with the same wavelength and in a phase-balanced manner relative to one another.

45. A laser system as defined in claim 44, wherein the master laser radiation cascade has several master semiconductor laser systems arranged in a cascade, one master semiconductor laser system, for its part, generating the master laser radiation for additional master semiconductor laser systems in said cascade.

46. A laser system comprising a fiber bundle consisting of single mode fibers each having a first end, said first ends together forming a fiber bundle from which a total radiation field formed from laser radiation exiting from the first ends of the fibers can exit, said total radiation field being adapted to be imaged onto a target surface, and each of said single mode fibers being coupled via a second end thereof to a respective subsystem adapted to generate the laser radiation, wherein:
  each subsystem comprises a plurality of semiconductor lasers operating in parallel, said semiconductor lasers being vertical emitters,
  within each subsystem, all of the semiconductor lasers operate with the same wavelength in a phase-balanced manner in relation to one another as a result of master laser radiation coupled into them, and
  individual laser radiation exiting from the individual semiconductor lasers of each subsystem is combinable, by means of a coupling device of that subsystem, to form a coherent laser radiation field adapted to be coupled into the single mode fiber associated with the respective subsystem.

47. A laser system comprising a single mode fiber having a first end from which laser radiation can exit, said laser radiation being adapted to be imaged onto a target surface, and said single mode fiber being coupled via a second end thereof to a subsystem adapted to generate the laser radiation, wherein:
  the subsystem comprises a plurality of semiconductor lasers operating in parallel,
  all of said semiconductor lasers of the subsystem operate with the same wavelength in a phase-balanced manner in relation to one another as a result of master laser radiation coupled into them, said master laser radiation being adapted to be coupled into the semiconductor lasers through an output side thereof, and
  individual laser radiation exiting from the individual semiconductor lasers of the subsystem is combinable, by means of a coupling device of the subsystem, to form a coherent laser radiation field adapted to be coupled into said single mode fiber.

48. A laser system comprising a single mode fiber having a first end from which laser radiation can exit, said laser radiation being adapted to be imaged onto a target surface, and said single mode fiber being coupled via a second end thereof to a subsystem adapted to generate the laser radiation, wherein:
  the subsystem comprises a plurality of semiconductor lasers being arranged on a surface and operating in parallel, all of said semiconductor lasers of the subsystem operate with the same wavelength in a phase-balanced manner in relation to one another as a result of master laser radiation coupled into them, and individual laser radiation exiting from the individual semiconductor lasers of the subsystem is combinable, by means of a coupling device of the subsystem, to form a coherent laser radiation field adapted to be coupled into said single mode fiber.

49. A laser system comprising a single mode fiber having a first end from which laser radiation can exit, said laser radiation being adapted to be imaged onto a target surface, and said single mode fiber being coupled via a second end thereof to a subsystem adapted to generate the laser radiation, wherein:

the subsystem comprises a plurality of semiconductor lasers operating in parallel, all of said semiconductor lasers of the subsystem operate with the same wavelength in a phase-balanced manner in relation to one another as a result of master laser radiation coupled into them, individual laser radiation exiting from the individual semiconductor lasers of the subsystem is combinable, by means of a coupling device of the subsystem, to form a coherent laser radiation field adapted to be coupled into said single mode fiber, and said coupling device comprises optical imaging means, said optical imaging means being adapted to form from each individual laser radiation individual laser radiation fields propagating parallel to one another and each having essentially plane wave fronts.

50. A laser system comprising a single mode fiber having a first end from which laser radiation can exit, said laser radiation being adapted to be imaged onto a target surface, and said single mode fiber being coupled via a second end thereof to a subsystem adapted to generate the laser radiation, wherein:

the subsystem comprises a plurality of semiconductor lasers operating in parallel, all of said semiconductor lasers of the subsystem operate with the same wavelength in a phase-balanced manner in relation to one another as a result of master laser radiation coupled into them, individual laser radiation exiting from the individual semiconductor lasers of the subsystem is combinable, by means of a coupling device of the subsystem, to form a coherent laser radiation field adapted to be coupled into said single mode fiber, said coupling means comprise optical imaging means for forming from each individual laser radiation a laser radiation field having an essentially parallel wave front, and said optical imaging means comprise a phase plate effecting an even distribution of the intensity with essentially a plane wave front over a cross section of the respective individual laser radiation field.

51. A laser system comprising a subsystem adapted to generate a coherent laser radiation field, said coherent laser radiation field being adapted to be imaged onto a target surface, wherein:

the subsystem comprises a plurality of semiconductor lasers operating in parallel, all of said semiconductor lasers of the subsystem operate with the same wavelength in a phase-balanced manner in relation to one another as a result of master laser radiation coupled into them, said master laser radiation being adapted to be coupled into the semiconductor lasers through an output side thereof, and individual laser radiation exiting from the individual semiconductor lasers of the subsystem is combinable by means of a coupling device of the subsystem, said coupling device comprising optical imaging means adapted to form said coherent laser radiation field from said individual laser radiation.

52. A laser system as defined in claim 51, wherein the master laser radiation is adapted to be coupled into the semiconductor lasers via a coupling-in element of the subsystem penetrated by the individual laser radiation.

53. A laser system as defined in claim 51, wherein the master laser radiation is adapted to be coupled into the semiconductor lasers via a coupling-in element of the subsystem penetrated by the coherent laser radiation field.

54. A laser system comprising a subsystem adapted to generate a coherent laser radiation field, said coherent laser radiation field being adapted to be imaged onto a target surface, wherein:

said subsystem comprises a plurality of semiconductor lasers being arranged on a surface and operating in parallel, all of said semiconductor lasers of the subsystem operate with the same wavelength in a phase-balanced manner in relation to one another as a result of master laser radiation coupled into them, and individual laser radiation exiting from the individual semiconductor lasers of the subsystem is combinable by means of a coupling device of the subsystem, said coupling device comprises optical imaging means adapted to form said coherent laser radiation field from said individual laser radiation.

55. A laser system as defined in claim 54, wherein the master laser radiation is adapted to be coupled into the semiconductor lasers via a coupling-in element of the subsystem penetrated by the individual laser radiation.

56. A laser system as defined in claim 54, wherein the master laser radiation is adapted to be coupled into the semiconductor lasers via a coupling-in element of the subsystem penetrated by the coherent laser radiation field.

57. A laser system comprising a subsystem adapted to generate a coherent laser radiation field, said coherent laser radiation field being adapted to be imaged onto a target surface, wherein:

said subsystem comprises a plurality of semiconductor lasers operating in parallel, all of said semiconductor lasers of the subsystem operate with the same wavelength in a phase-balanced manner in relation to one another as a result of master laser radiation coupled into them, individual laser radiation exiting from the individual semiconductor lasers of the subsystem is combinable by means of a coupling device of the subsystem to form said coherent laser radiation field, said coupling device comprises optical imaging means, and said optical imaging means are adapted to form from each individual laser radiation individual laser radiation fields propagating parallel to one another and each having essentially plane wave fronts.

58. A laser system comprising a subsystem adapted to generate a coherent laser radiation field, said coherent laser radiation field being adapted to be imaged onto a target surface, wherein:

said subsystem comprises a plurality of semiconductor lasers operating in parallel, all of said semiconductor lasers of the subsystem operate with the same wavelength in a phase-balanced manner in relation to one another as a result of master laser radiation coupled into them, individual laser radiation exiting from the individual semiconductor lasers of the subsystem is combinable by means of a coupling device of the subsystem to form said coherent laser radiation field, said coupling means comprise optical imaging means for forming from each individual laser radiation a laser radiation field having an essentially parallel wave front, and said optical imaging means comprise a phase plate effecting an even intensity distribution with essentially a plane wave front over a cross section of the respective individual laser radiation field.

* * * * *